(12) United States Patent
Yan et al.

(10) Patent No.: US 12,206,433 B2
(45) Date of Patent: Jan. 21, 2025

(54) ETHERNET CODING METHOD AND APPARATUS

(71) Applicant: HUAWEI TECHNOLOGIES CO., LTD., Guangdong (CN)

(72) Inventors: Zengchao Yan, Shenzhen (CN); Huixiao Ma, Shenzhen (CN); Zhongfeng Wang, Nanjing (CN); Jun Lin, Nanjing (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 18/309,014

(22) Filed: Apr. 28, 2023

(65) Prior Publication Data
US 2023/0268932 A1 Aug. 24, 2023

Related U.S. Application Data

(63) Continuation of application No. PCT/CN2021/101722, filed on Jun. 23, 2021.

(30) Foreign Application Priority Data

Oct. 29, 2020 (CN) .......................... 202011183088.7

(51) Int. Cl.
*H03M 13/15* (2006.01)
*H03M 13/19* (2006.01)
(52) U.S. Cl.
CPC ..... *H03M 13/1515* (2013.01); *H03M 13/152* (2013.01); *H03M 13/19* (2013.01)
(58) Field of Classification Search
None
See application file for complete search history.

(56) References Cited

U.S. PATENT DOCUMENTS 7,933,365 B2 * 4/2011 Choi ..................... H04L 27/06
375/262
8,898,550 B2 11/2014 Cideciyan
(Continued)

FOREIGN PATENT DOCUMENTS

CN 111654353 A 9/2020

OTHER PUBLICATIONS 802.3bs-2017—IEEE Standard for Ethernet—Amendment 10: Media Access Control Parameters, Physical Layers, and Management Parameters for 200 GB/s and 400 GB/s Operation, 372 pages.
(Continued)

*Primary Examiner* — Daniel F. McMahon
(74) *Attorney, Agent, or Firm* — WOMBLE BOND DICKINSON (US) LLP

(57) ABSTRACT

This application discloses an Ethernet coding method and apparatus, to adapt to a scenario in which a higher transmission bit error rate is caused by a high bandwidth. The method includes: a transmit end encodes first to-be-encoded information by using a first forward error correction (FEC) codeword, to obtain first encoded data, where the first forward error correction FEC codeword is a Reed-Solomon forward error correction (RS-FEC) codeword; and the transmit end encodes the first encoded data by using a second FEC codeword, to obtain second encoded data, where a code length N and an information bit length K of the second FEC codeword satisfy the following formula: $M1*N/K \leq M2$, where M1 is a throughput of the first encoded data, and M2 is a throughput of the second encoded data.

21 Claims, 15 Drawing Sheets

(56) References Cited

U.S. PATENT DOCUMENTS

| | | | |
|---|---|---|---|
| 9,009,577 B1* | 4/2015 | Tarn | H03M 13/2909 |
| | | | 714/752 |
| 9,037,940 B2 | 5/2015 | Wang et al. | |
| 9,853,769 B1* | 12/2017 | Farjad | H04L 1/0041 |
| 11,128,320 B2* | 9/2021 | Lu | H04L 1/0065 |
| 2003/0188253 A1* | 10/2003 | Kauschke | H03M 13/2948 |
| | | | 714/782 |
| 2005/0005189 A1* | 1/2005 | Khermosh | H04L 1/0057 |
| | | | 714/4.1 |
| 2007/0300127 A1* | 12/2007 | Watson | H04L 1/0064 |
| | | | 714/752 |
| 2010/0226392 A1* | 9/2010 | Lee | H04L 1/0071 |
| | | | 714/792 |
| 2011/0138247 A1* | 6/2011 | Limberg | H04L 1/0041 |
| | | | 714/751 |
| 2020/0091938 A1* | 3/2020 | Tu | H03M 13/2707 |
| 2022/0077958 A1* | 3/2022 | He | H03M 13/1515 |

OTHER PUBLICATIONS 802.3bj-2014—IEEE Standard for Ethernet Amendment 2: Physical Layer Specifications and Management Parameters for 100 GB/s Operation Over Backplanes and Copper Cables, 368 pages.

He Xiang et al: "FEC Architecture of B400GbE to Support BER Objective", IEEE 802.3 Beyond 400G Study Group, May 1, 2021 (May 1, 2021), XP093120411, 19 pages.

IEEE Std 802.3—2018, (Revision of IEEE Std 802.Mar. 2015), IEEE Standard for Ethernet, LAN/MAN Standards Committee of the IEEE Computer Society, Approved Jun. 14, 2018, IEEE-SA Standards Board, 5600 pages.

Mark Gustlin-Xilinx et al: "Investigation on Technical Feasibility of Stronger RS FEC for 400GbE", Jan. 13, 2015, 19 pages.

Pete Anslow et al: "A 400GbE Architectural Option", IEEE P802. 3bs 400 GB/s Ethernet Task Force, May 2014, 19 pages.

Zhongfeng Wang et al: "FEC Configuration Analyses For 400Gb Ethernet", IEEE 802.3bs meeting, Kanata, Canada, Sep. 2014, 9 pages.

* cited by examiner

ETHERNET CODING METHOD AND APPARATUS

CROSS-REFERENCE TO RELATED APPLICATIONS

This application is a continuation of International Application No. PCT/CN2021/101722, filed on Jun. 23, 2021, which claims priority to Chinese Patent Application No. 202011183088.7, filed on Oct. 29, 2020. The disclosures of the aforementioned applications are hereby incorporated by reference in their entireties.

TECHNICAL FIELD

Embodiments of this application relate to the field of coding technologies, and in particular, to an Ethernet coding method and apparatus.

BACKGROUND

With rapid growth of a network service throughput, a service bandwidth of a communication device also increases rapidly. The International Standards Organization has defined the IEEE802.3 Ethernet protocol, and 100GE, 200GE, and 400GE interface protocols have been defined in the IEEE802.3 Ethernet protocol. Big data transmission has a higher requirement on a high bandwidth, which puts pressure on data center architectures and underlying interconnections. Based on this consideration, standardization of the next-generation Ethernet 800G has been carried out.

Although the Ethernet 800G can provide a higher transmission bandwidth, it will increase transmission bit errors. How to provide a coding method with higher error correction performance is a problem that urgently needs to be resolved.

SUMMARY

Embodiments of this application provide an Ethernet coding method and apparatus, to provide a coding method with higher error correction performance, so as to adapt to a scenario in which a higher transmission bit error rate is caused by a high bandwidth.

According to a first aspect, an Ethernet coding method is provided. The method may be performed by a transmit end, or referred to as an encoding device. Operations of the method include: The transmit end encodes first to-be-encoded information by using a first FEC codeword, to obtain first encoded data, where the first FEC codeword is a Reed-Solomon forward error correction (RS-FEC) code; and the transmit end encodes the first encoded data by using a second FEC codeword, to obtain second encoded data. A code length N and an information bit length K of the second FEC codeword satisfy the following formula: $M1*N/K \leq M2$, where M1 is a throughput of the first encoded data, and M2 is a throughput of the second encoded data. It can be learned that Ethernet 800G or an even higher throughput requirement can be supported by using a coding scheme in which two FEC codewords are concatenated, and error correction performance is improved by increasing overheads (OHs) of FEC encoding of a system and by designing the second FEC codeword. The Ethernet 800G uses a higher baud rate for transmission and has a higher pre-correction bit error rate. The coding scheme in which two FEC codewords are concatenated is used, so that error correction performance of the Ethernet can be improved to meet an error correction performance indicator of the Ethernet 800G. The constraint condition $M1*N/K \leq M2$ is set, so that bandwidth and transmission performance limitations of optical components can be met. Most of 100GE, 200GE, and 400GE interface protocols in the IEEE 802.3 standard is flexibly supported and is compatible while meeting a technical indicator requirement of the next-generation Ethernet.

In a possible embodiment, that the transmit end performs FEC encoding on first to-be-encoded information by using a first FEC codeword, to obtain first encoded data is implemented in the following manner: The transmit end performs FEC encoding on the first to-be-encoded information by using y first FEC codewords, to obtain y groups of encoded data, where y is an even number greater than or equal to 2; and the transmit end performs first interleaving on the y groups of encoded data to obtain the first encoded data, where the first interleaving meets an interleaving matrix in which quantities of rows and columns are respectively L and P, L and P are even numbers greater than or equal to 2, and P is a quantity of physical medium attachment PMA sublayer lanes. In this way, encoded data obtained through encoding by using the first FEC codeword can be more fully interleaved, and the error correction performance can be improved. Interleaving between the first FEC codeword (an RS codeword) and the second FEC codeword (inner-FEC) is to aggregate bit errors left after encoding by using the inner-FEC into one RS symbol (10 bits), so that a Hamming distance at a symbol level between the RS and the inner-FEC is minimized, and error correction efficiency of the RS is improved.

In a possible embodiment, row elements in a row of the interleaving matrix respectively correspond to data obtained from the y groups of encoded data in a round robin manner. In this interleaving manner, different RS symbols at a PCS layer can be more randomly and evenly allocated to the second FEC codeword (inner-FEC), thereby improving a burst error resistance capability of the system. Such interleaving can be compatible with a quantity of RS codewords at each flow of PCS layer, and symbols of RS codewords in a data stream at the PCS layer do not need to be distinguished, thereby reducing an operation of identifying an RS symbol boundary.

In a possible embodiment, a same round robin rule is used for each of the L rows, or round robin rules are different for every consecutive y rows in the L rows.

In a possible embodiment, that the transmit end encodes the first encoded data by using a second FEC codeword is implemented in the following manner: The transmit end transmits the first encoded data through P PMA lanes, and encodes the first encoded data transmitted through the P PMA lanes.

In a possible embodiment, the transmit end transmits the second encoded data through P PMA lanes, and processes the second encoded data transmitted through the P PMA lanes.

In a possible embodiment, that the transmit end performs first interleaving on the y groups of encoded data is implemented in the following manner: The transmit end transmits the y groups of encoded data through P PMA lanes, and performs the first interleaving on the y groups of encoded data transmitted through the P PMA lanes.

In a possible embodiment, the P PMA lanes correspond to sequence numbers 0 to (P−1), and the P columns of the interleaving matrix respectively one-to-one correspond to encoded data from the P PMA lanes. Row elements whose column sequence numbers are odd numbers in a row of the interleaving matrix respectively correspond to encoded data of PMA lanes whose sequence numbers are 0 to (P/2−1), and row elements whose column sequence numbers are even numbers in the row of the interleaving matrix respectively correspond to encoded data of PMA lanes whose sequence numbers are P/2 to P. In such an interleaving method embodiment, a symbol boundary does not need to be identified, so that a PMA layer does not need to know a format of a data frame at the PCS layer, and directly performs multiplexing and 10-bit distribution on a data stream received at the PMA layer. 10 bits exactly match sizes of symbols of the second FEC codeword, thereby improving a burst error resistance capability of the system, and an implementation is simple.

In a possible embodiment, a value of P may be an integral power of 2, for example, 16 or 32.

In a possible embodiment, K further satisfies the following condition: N1/K is a positive integer, and N1 is a code length of the first FEC codeword. In this way, an output of the first FEC codeword (namely, an input of the second FEC codeword) may be equally divided into integral parts, each part is K, and each input does not need to be filled with bits. In this way, the coding scheme in which the first FEC codeword and the second FEC codeword are concatenated is simpler and easier to implement, and has low complexity.

In a possible embodiment, N and K further satisfy the following condition: M1*N/K=reference clock×W, where W is a positive integer. An Ethernet coding scheme corresponding to the second FEC codeword can make implementation of Ethernet clock extraction and synchronization simpler. Only when W is an integer, a PLL can be adjusted in an entire lattice point, and clock extraction and synchronization are easy to implement. In this way, phase locking of the PLL can be completed more quickly, is easy to implement, and has low complexity.

W may be 4×reference clock multiplier RCM.

In a possible embodiment, M1=106.25 Gbps, and M2=114 Gbps.

In a possible embodiment, N/K=18/17.

In a possible embodiment, construction of the second FEC codeword is (N,K,m), N is a quantity of bits included in the second FEC codeword, K is a quantity of bits included in an information bit, and m is an order of a Galois field in which the second FEC codeword is located. The second FEC codeword includes any one of the following codewords, includes a spatially coupled code constructed by using any one of the following codewords as a subcode, or includes a multi-level code constructed by using any one of the following codewords as a subcode: Hamming code Hamming (144,136,8), Hamming(180,170,10), extended Hamming code eHamming(180,170,9), double extended Hamming code DE-Hamming(180,170,8), BCH(360,340,10), double extended BCH code DE-BCH(360,340,9), DE-BCH(576, 544,10), BCH(594,561,11), or Hamming(180,170,10).

In a possible embodiment, construction of the second FEC codeword is (N,K,m), N is a quantity of bits included in the second FEC codeword, K is a quantity of bits included in an information bit, and m is an order of a Galois field in which the FEC codeword is located. The second FEC codeword includes any one of the following codewords, includes a spatially coupled code constructed by using any one of the following codewords as a subcode, or includes a multi-level code constructed by using any one of the following codewords as a subcode: Hamming(126,119,7), Hamming(127,119,8), Hamming(145,136,9), Hamming(179,170,9), eHamming(127,119,7), eHamming(145,136,8), eHamming(179,170,8), eHamming(181,170,10), BCH(290, 272,9), BCH(358,340,9), BCH(574,544,10), extended BCH code eBCH(291,272,9), eBCH(359,340,9), eBCH(361,340, 10), eBCH(575,544,10), or DE-BCH(362,340,10).

In a possible embodiment, the transmit end performs one or more of the following processing on the second encoded data: transmission through the P PMA lanes, second interleaving, data modulation, or optical-to-electrical conversion, where P is an even number greater than or equal to 2. The transmit end sends processed data to a receiving device.

In a possible embodiment, N=x*n and K=x*k; and x, n, and k are positive integers.

According to the Ethernet coding method provided in this embodiment of this application and the coding scheme in which the first FEC codeword and the second FEC codeword are concatenated, an outer code of a concatenated code uses the original standard RS codeword, and an inner code of the concatenated code uses the second FEC codeword, namely, the inner-FEC codeword. The coding method can be compatible with 100GE, 200GE, and 400GE Ethernet RS(544,514,10) coding, and entire FEC encoding overheads (OHs) are increased by using a coding method in which RS(544,514,10) and the inner-FEC codeword are concatenated. System link FEC encoding OHs are increased, which improves the error correction performance of the system. In this way, a performance indicator of the next-generation high-speed Ethernet is met, a delay requirement of the next-generation Ethernet is met, and implementation costs are low.

An encoder component of the inner-FEC codeword may be disposed at the PCS layer, or may be disposed at the PMA layer. When the encoder component of the inner-FEC codeword is disposed at the PMA layer, RS encode at the PCS layer is decoupled from inner-FEC encode at the PMA layer, so that the inner-FEC encode at the PMA layer can be completed when inherent bit errors at a C2M optical/electrical interface are included. When the encoder component of the inner-FEC codeword is disposed at the PCS layer, the concatenated coding scheme can also be completed.

According to a second aspect, an Ethernet coding apparatus is provided. The apparatus has a function of implementing the method in any one of the first aspect and the possible embodiments of the first aspect. The function may be implemented by hardware, or may be implemented by hardware executing corresponding software. The hardware or the software includes one or more modules corresponding to the foregoing function. In an embodiment, the apparatus may include an obtaining module and a processing module. For example, the obtaining module is configured to obtain first to-be-encoded information; and the processing module is configured to encode the first to-be-encoded information by using a first forward error correction FEC codeword, to obtain first encoded data, where the first forward error correction FEC codeword is a Reed-Solomon forward error correction RS-FEC codeword. The processing module is further configured to encode the first encoded data by using a second FEC codeword, to obtain second encoded data, where a code length N and an information bit length K of the second FEC codeword satisfy the following formula: M1*N/K≤M2. M1 is a throughput of the first encoded data, and M2 is a throughput of the second encoded data.

In a possible embodiment, when performing FEC encoding on the first to-be-encoded information by using the first FEC codeword, to obtain the first encoded data, the processing module is configured to: perform FEC encoding on the first to-be-encoded information by using y first FEC codewords, to obtain y groups of encoded data, where y is an even number greater than or equal to 2; and perform first interleaving on the y groups of encoded data to obtain the first encoded data, where the first interleaving meets an interleaving matrix in which quantities of rows and columns are respectively L and P, L and P are even numbers greater than or equal to 2, and P is a quantity of physical medium attachment PMA sublayer lanes.

In a possible embodiment, row elements in a row of the interleaving matrix respectively correspond to data obtained from the y groups of encoded data in a round robin manner.

In a possible embodiment, a same round robin rule is used for each of the L rows, or round robin rules are different for every consecutive y rows in the L rows.

In a possible embodiment, when encoding the first encoded data by using the second FEC codeword, the processing module is configured to: transmit the first encoded data through P PMA lanes; and encode the first encoded data transmitted through the P PMA lanes.

In a possible embodiment, the processing module is further configured to: transmit the second encoded data through P PMA lanes, and process the second encoded data transmitted through the P PMA lanes.

In a possible embodiment, when performing the first interleaving on the y groups of encoded data, the processing module is configured to: transmit the y groups of encoded data through P PMA lanes; and perform the first interleaving on the y groups of encoded data transmitted through the P PMA lanes.

In a possible embodiment, the P PMA lanes correspond to sequence numbers 0 to (P−1), and the P columns of the interleaving matrix respectively one-to-one correspond to encoded data from the P PMA lanes. Row elements whose column sequence numbers are odd numbers in a row of the interleaving matrix respectively correspond to encoded data of PMA lanes whose sequence numbers are 0 to (P/2−1), and row elements whose column sequence numbers are even numbers in the row of the interleaving matrix respectively correspond to encoded data of PMA lanes whose sequence numbers are P/2 to P.

In a possible embodiment, a value of P is 16 or 32.

In a possible embodiment, K further satisfies the following condition: N1/K is a positive integer, and N1 is a code length of the first FEC codeword.

In a possible embodiment, N and K further satisfy the following condition: M1*N/K=reference clock×W, where W is a positive integer.

In a possible embodiment, W=4×reference clock multiplier RCM.

In a possible embodiment, M1=106.25 Gbps, and M2=114 Gbps.

In a possible embodiment, N/K=18/17.

In a possible embodiment, construction of the second FEC codeword is (N,K,m), N is a quantity of bits included in the second FEC codeword, K is a quantity of bits included in an information bit, and m is an order of a Galois field in which the second FEC codeword is located. The second FEC codeword includes any one of the following codewords, includes a spatially coupled code constructed by using any one of the following codewords as a subcode, or includes a multi-level code constructed by using any one of the following codewords as a subcode: Hamming code Hamming (144,136,8), Hamming(180,170,10), extended Hamming code eHamming(180,170,9), double extended Hamming code DE-Hamming(180,170,8), BCH(360,340,10), double extended BCH code DE-BCH(360,340,9), DE-BCH(576, 544,10), BCH(594,561,11), or Hamming(180,170,10).

In a possible embodiment, construction of the second FEC codeword is (N,K,m), N is a quantity of bits included in the second FEC codeword, K is a quantity of bits included in an information bit, and m is an order of a Galois field in which the FEC codeword is located. The second FEC codeword includes any one of the following codewords, includes a spatially coupled code constructed by using any one of the following codewords as a subcode, or includes a multi-level code constructed by using any one of the following codewords as a subcode: Hamming(126,119,7), Hamming(127,119,8), Hamming(145,136,9), Hamming (179,170,9), eHamming(127,119,7), eHamming(145,136,8), eHamming(179,170,8), eHamming(181,170,10), BCH(290, 272,9), BCH(358,340,9), BCH(574,544,10), extended BCH code eBCH(291,272,9), eBCH(359,340,9), eBCH(361,340, 10), eBCH(575,544,10), or DE-BCH(362,340,10).

In a possible embodiment, the processing module is further configured to perform one or more of the following processing on the second encoded data: transmission through the P PMA lanes, second interleaving, data modulation, or optical-to-electrical conversion, where P is an even number greater than or equal to 2. The apparatus further includes a communication module, configured to send processed data to a receiving device.

In a possible embodiment, N=x*n and K=x*k; and x, n, and k are positive integers.

For beneficial effect of the second aspect, refer to corresponding descriptions of the first aspect. Details are not described herein again.

According to a third aspect, an Ethernet coding apparatus is provided. The apparatus has a function of implementing the method in any one of the first aspect and the possible embodiments of the first aspect. The function may be implemented by hardware, or may be implemented by hardware executing corresponding software. The hardware or the software includes one or more modules corresponding to the foregoing function.

In a possible embodiment, when some or all of the functions are implemented by hardware, the Ethernet coding apparatus includes: an input interface circuit, configured to obtain first to-be-encoded information; a logic circuit, configured to perform, based on the obtained first to-be-encoded information, the behavior in any one of the first aspect and the possible embodiments of the first aspect; and an output interface circuit, configured to output second encoded data.

In some embodiments, the Ethernet coding apparatus may be a chip or an integrated circuit.

In a possible embodiment, when some or all of the functions are implemented by software, the Ethernet coding apparatus includes: a memory, configured to store a program or instructions; and a processor, configured to execute the program or the instructions stored in the memory. When the program or the instructions are executed, the method in any one of the first aspect and the possible embodiments of the first aspect is implemented.

In some embodiments, the memory may be a physically independent unit, or may be integrated with the processor.

In a possible embodiment, when some or all of the functions are implemented by software, the Ethernet coding apparatus includes a processor. A memory configured to store a program is located outside of the coding apparatus, and the processor is connected to the memory through a circuit/cable, and is configured to read and execute the program stored in the memory.

According to a fourth aspect, a computer-readable storage medium is provided, and stores computer-readable instructions. When the computer-readable instructions are run on a computer, the method according to any one of the first aspect and the possible embodiments of the first aspect is performed.

According to a fifth aspect, an embodiment of this application provides a computer program product including instructions. When the computer program product runs on a computer, the method according to any one of the first aspect and the possible embodiments of the first aspect is performed.

According to a sixth aspect, an embodiment of this application provides a chip system. The chip system includes a processor, and may further include a memory, to implement the method in any one of the first aspect or the possible embodiments of the first aspect. The chip system may include a chip, or may include a chip and another discrete component.

DESCRIPTION OF EMBODIMENTS

Embodiments of this application provide an Ethernet coding method and apparatus, to improve error correction performance of Ethernet coding. The method and the apparatus are based on a same technical idea. Because a problem-resolving principle of the method is similar to a problem-resolving principle of the apparatus, mutual reference may be made to embodiments of the apparatus and the method. Repeated parts are not described in detail.

In descriptions of embodiments of this application, the term "and/or" describes an association relationship between associated objects and indicates that three relationships may exist. For example, A and/or B may indicate the following three cases: Only A exists, both A and B exist, and only B exists. A plurality of in this application means two or more. In addition, it should be understood that in description of this application, terms such as "first" and "second" are merely used for distinguishing and description, but should not be understood as indicating or implying relative importance, or should not be understood as indicating or implying a sequence.

The Ethernet coding method provided in embodiments of this application may be applied to the Ethernet, or may be applied to another network that uses forward error correction (FEC) encoding. Embodiments of this application are applicable to application scenarios with large traffic and short latency, such as short-distance interconnection, cloud storage, cloud computing, and a 5th generation (5G) base station backbone network of a data center.

The following describes in detail embodiments of this application with reference to accompanying drawings.

Figure 1A:
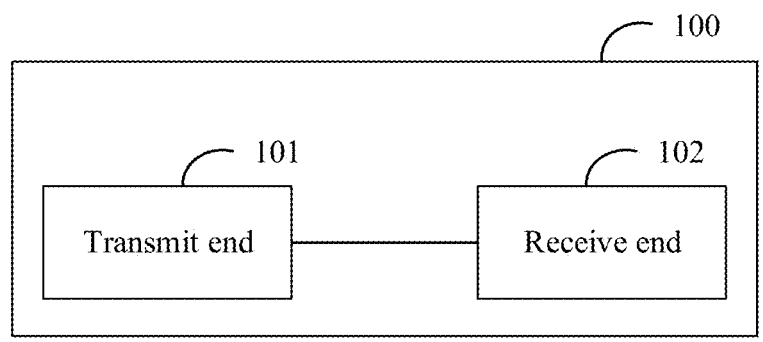
FIG. 1a is a schematic diagram of a structure of a communication system according to an embodiment of this application.
Figure 1B:
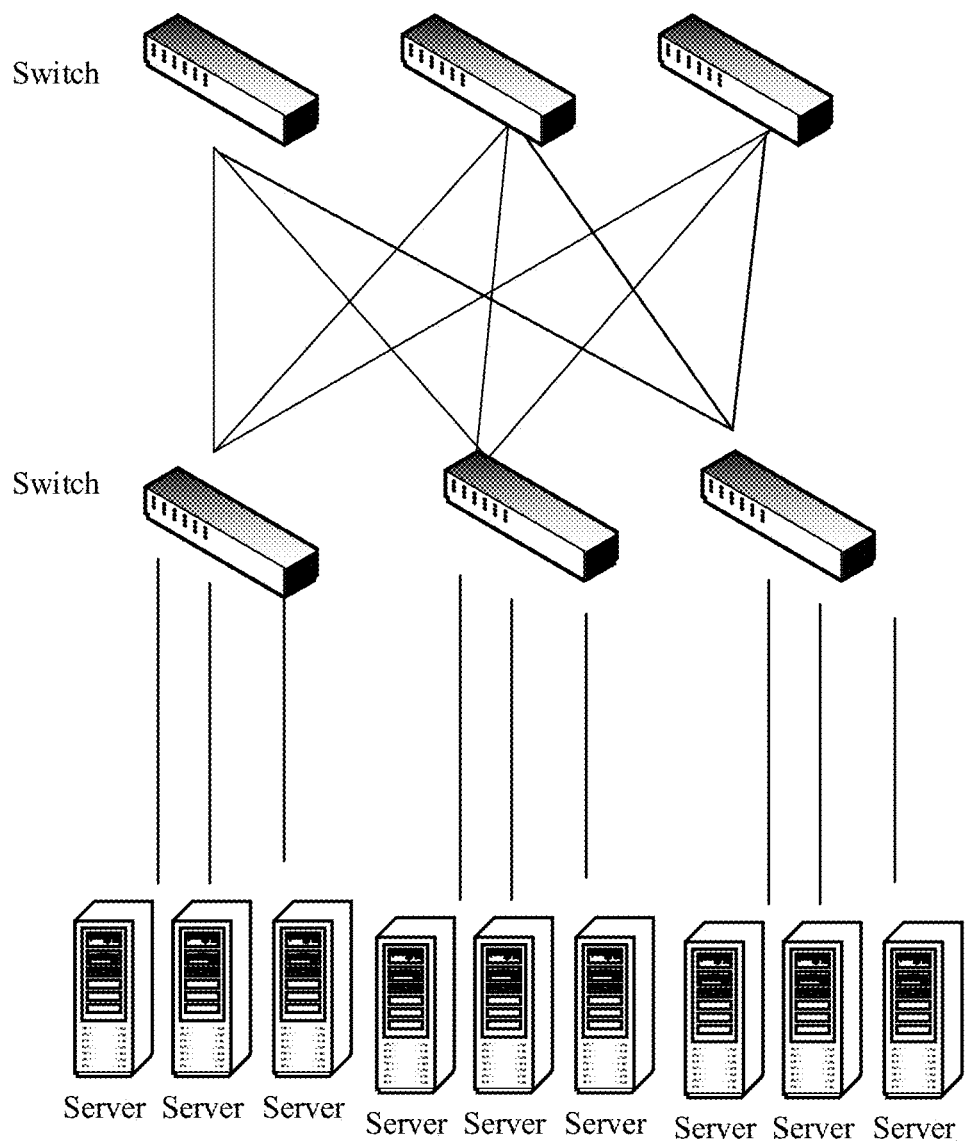
FIG. 1b is a schematic diagram of an Ethernet architecture according to an embodiment of this application.

FIG. 1a is a schematic diagram of a structure of a communication system 100 to which embodiments of this application are applicable. The communication system includes a transmit end 101 and a receive end 102. The transmit end may also be referred to as a sending device, and the receive end may also be referred to as a receiving device. The transmit end may further be referred to as a sending apparatus, and the receive end may further be referred to as a receiving apparatus. In embodiments of this application, the transmit end and the receive end are used as examples for description. When embodiments of this application are applied to the Ethernet, both the transmit end and the receive end support the IEEE802.3 Ethernet protocols. FIG. 1b is a schematic diagram of an Ethernet architecture to which embodiments of this application are applicable. The Ethernet architecture includes switches and servers in a data center. The switches may be connected, and the switches may alternatively be connected to the servers. It may be understood that FIG. 1b is a schematic diagram, and an actual Ethernet network may further include more or fewer switches and more or fewer servers. A connection manner between switches and a connection manner between a switch and a server are examples.

In the Ethernet, the transmit end 101 is a switch, and the receive end 102 is a switch; the transmit end 101 is a switch, and the receive end 102 is a server; or the transmit end 101 is a server, and the receive end 102 is a switch.

The method provided in embodiments of this application is applicable to a plurality of fields, for example, augmented reality/virtual reality (AR/VR), artificial intelligence (AI), 5G applications, or cloud applications. Applications in increasing fields generate increasing throughputs. Explosive growth of the throughputs requires a higher bandwidth. Therefore, standardization of the Ethernet 800G has been carried out. An increase in an Ethernet transmission bandwidth inevitably increases a quantity of transmission bit errors. Embodiments of this application provide an Ethernet coding method, to adapt to a higher Ethernet transmission bandwidth.

To better understand solutions provided in embodiments of this application, the following first describes coding schemes of 100GE, 200GE, and 400GE in the IEEE 802.3 standard, and some related concepts and terms.

1. 100GE

Figure 2:
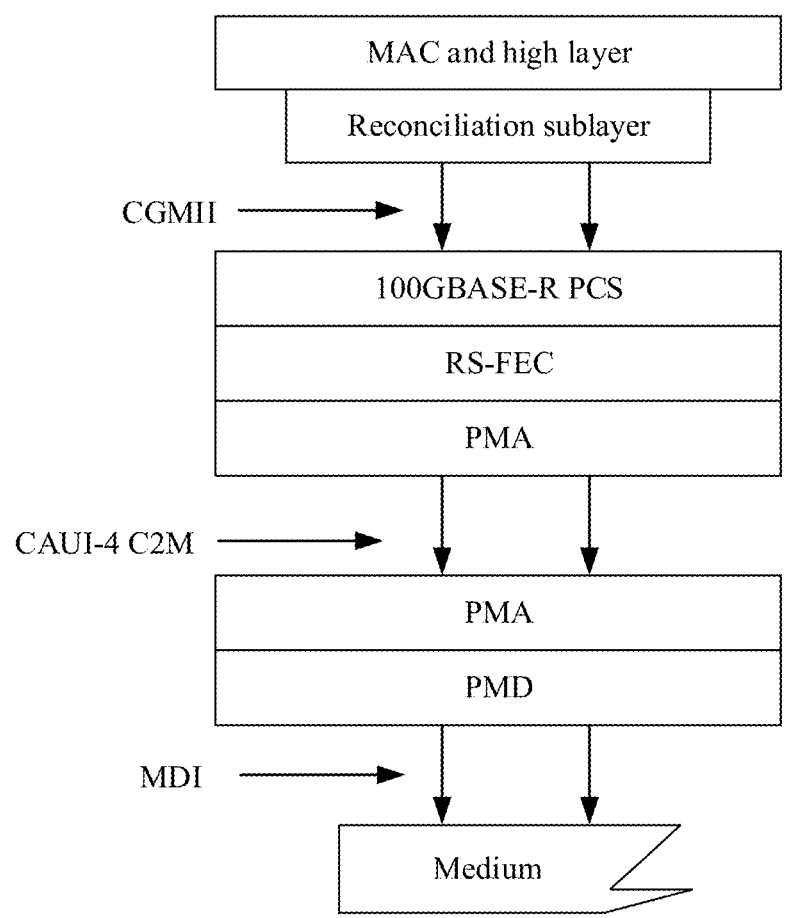
FIG. 2 is a schematic diagram of RS-FEC encoding of 100GE Ethernet according to an embodiment of this application.

In a 100GE Ethernet four-lane physical media dependent (PMD) layer, namely, KP4 application scenario, a Reed-Solomon (RS)(544,514,10) codeword is used in a coding scheme. A code length of the RS codeword is $n_{RS}$=544, an information symbol bit length is $k_{RS}$=514, and a Galois field is $GF(2^{10})$. FIG. 2 is a schematic flowchart of the coding scheme of the 100GE KP4 Ethernet. Data from clients of medium access control (MAC) layer and a higher layer passes through a reconciliation sublayer. The reconciliation sublayer translates the data from the clients of the MAC layer and the higher layer, and sends translated data to a 100GBASE-R physical coding sublayer (PCS) layer through a 100 Gb/s (bps, b/s) media independent interface (CGMII). The PCS layer performs operations such as transcode, scramble, and AM insertion on the data, and sends processed data to a Reed-Solomon forward error correction (RS-FEC) codeword for encoding. One RS(544,514,10) codeword is used for RS-FEC encoding of the 100GE Ethernet. An encoded codeword enters a physical medium attachment (PMA) sublayer to perform an operation such as multiplexing (Mux). An operated data stream is transmitted to a next PMA layer through a four-lane attachment unit interface (CAUI-4) chip-to-module (C2M) interface. After the data stream passes through the PMA, a PMD performs modulation and optical-to-electrical conversion on the data stream. A medium dependent interface (MDI) is used to transmit optical signals obtained through modulation and optical-to-electrical conversion to a receive end through a medium such as an optical fiber.

2. 200GE and 400GE

The RS(544,514,10) codeword is also used in coding schemes of the 200GE and 400GE Ethernet. The code length of the RS codeword is $n_{RS}$=544, the information symbol bit length is $k_{RS}$=514, and the Galois field is $GF(2^{10})$.

Figure 3:
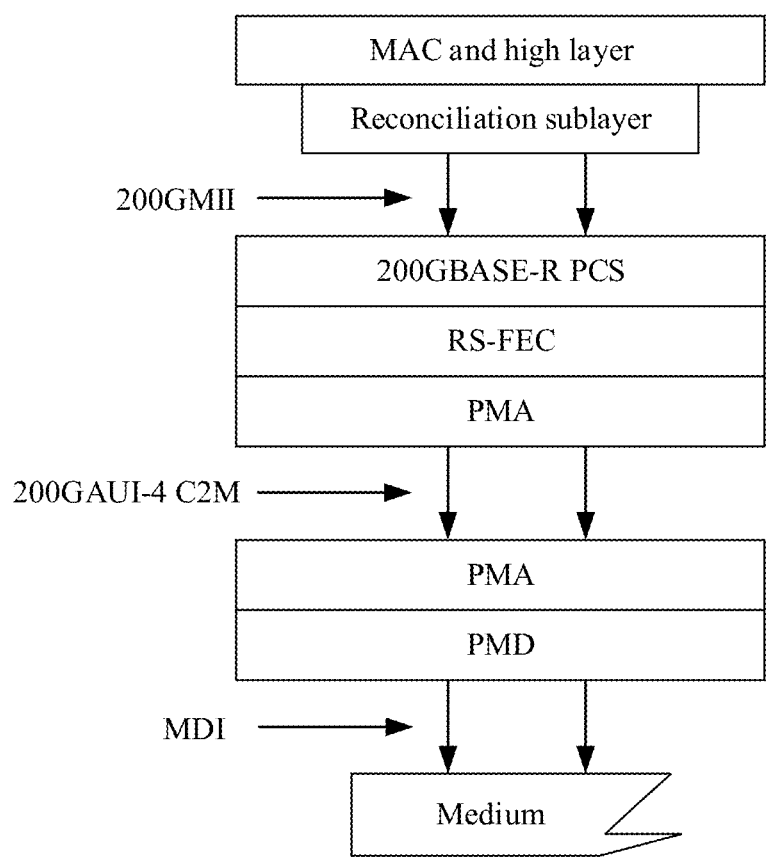
FIG. 3 is a schematic diagram of RS-FEC encoding of 200GE Ethernet according to an embodiment of this application.

FIG. 3 is a schematic flowchart of the coding scheme of the 200GE Ethernet. Data from clients of a MAC layer and a higher layer passes through a reconciliation sublayer. The reconciliation sublayer translates the data from the clients of the MAC layer and the higher layer, and sends translated data to a 200GBASE-R PCS layer through a 200GMII interface. The PCS layer performs operations such as transcode, scramble, and AM insertion on the data, and then sends processed data to an RS-FEC module for encoding. Two RS(544,514,10) codewords are used for RS-FEC encoding of the 200GE Ethernet, and a data stream from the PCS layer is sent to the two RS codewords in a 10-bit round robin distribution manner. Codewords obtained after the two RS codewords are separately encoded enter a PMA layer for operations such as Mux. An operated data stream is transmitted to a next PMA layer through a 200G four-lane attachment unit interface (CAUI-4) C2M interface. After the data stream passes through the PMA, a PMD performs modulation and optical-to-electrical conversion on the data stream. An MDI interface is used to transmit optical signals obtained through modulation and optical-to-electrical conversion to a receive end through a medium such as an optical fiber.

Figure 4:
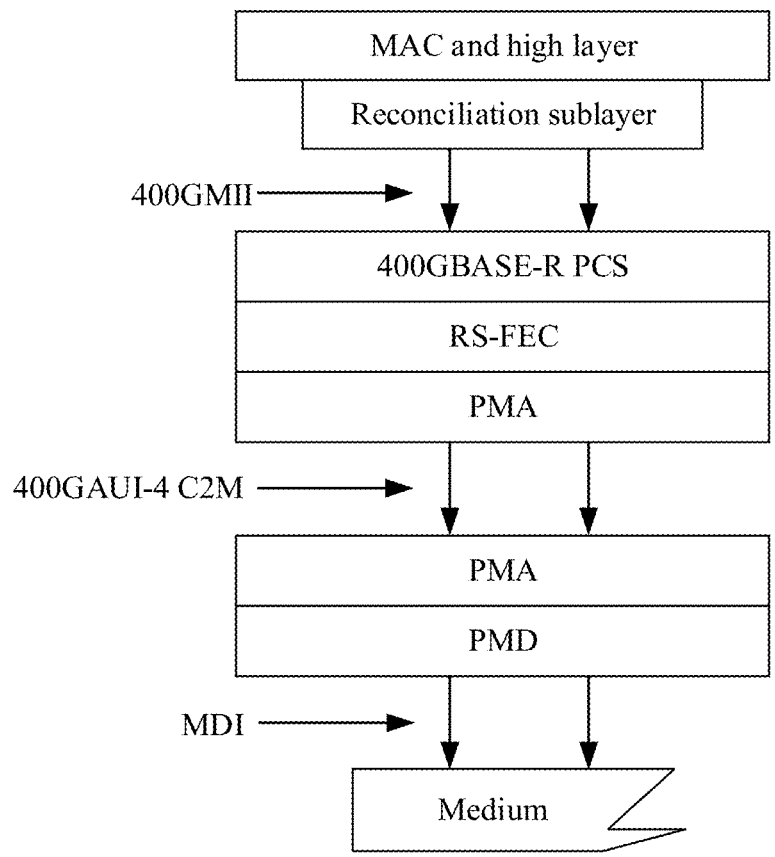
FIG. 4 is a schematic diagram of RS-FEC encoding of 400GE Ethernet according to an embodiment of this application.

FIG. 4 is a schematic flowchart of the coding scheme of the 400GE Ethernet. Data from clients of a MAC layer and a higher layer passes through a reconciliation sublayer. The reconciliation sublayer translates the data from the clients of the MAC layer and the higher layer, and sends translated data to a 400GBASE-R PCS layer through a 400GMII interface. The PCS layer performs operations such as transcode, scramble, and AM insertion on the data, and then sends processed data to an RS-FEC module for encoding. Two RS(544,514,10) codewords are used for RS-FEC encoding of the 400GE Ethernet, and a data stream from the PCS layer is sent to the two RS codewords in a 10-bit round robin distribution manner. Codewords obtained after the two RS codewords are separately encoded enter a PMA layer through Mux and 10-bit symbol distribution. A data stream output by the PMA layer is transmitted to a next PMA layer through a 400GAUI-4 C2M interface. After the data stream passes through the PMA, a PMD performs modulation and optical-to-electrical conversion on the data stream. An MDI interface is used to transmit optical signals obtained through modulation and optical-to-electrical conversion to a receive end through a medium such as an optical fiber.

In the coding schemes of the 100GE, the 200GE, and the 400GE Ethernet, RS encode is performed at the PCS layer. A data stream obtained through RS encode is transmitted from end to end. Errors caused by noises on an optical link and an electrical-layer interface are corrected by RS codes. However, when the Ethernet evolves to 800G, a single-wavelength rate increases from 100 Gbps of the 400GE to 200 Gbps, and a pre-FEC bit error rate horizontally increases due to a component constraint. Therefore, an Ethernet coding method with a stronger error correction capability is needed, and compatibility and interconnection with a data stream in an original solution may be improved.

Figure 5:
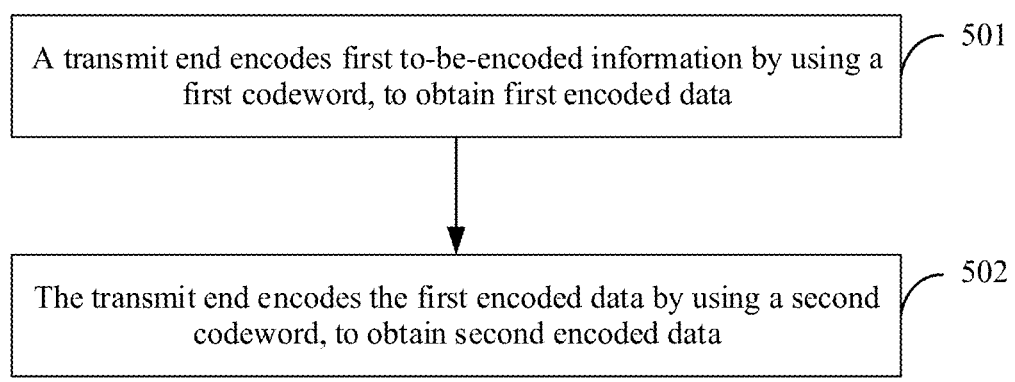
FIG. 5 is a schematic flowchart 1 of an Ethernet coding method according to an embodiment of this application.

In view of this, an embodiment of this application provides an Ethernet coding method. As shown in FIG. 5, an example procedure of the Ethernet coding method provided in this embodiment of this application is described as follows: The method may be performed by a sending device, a transmit end, or a sending apparatus.

S501: The transmit end encodes first to-be-encoded information by using a first codeword, to obtain first encoded data.

The first codeword may be a forward error correction (FEC) codeword, and is denoted as a first FEC codeword. For example, the first codeword may be an RS-FEC codeword, or may be referred to as an RS codeword or an RS code.

S502: The transmit end encodes the first encoded data by using a second codeword, to obtain second encoded data.

The second codeword may be an FEC codeword, and is denoted as a second FEC codeword.

It can be learned that, a coding scheme in which two FEC codewords are concatenated is used in this embodiment of this application, to support the Ethernet 800G or even a higher throughput requirement. The Ethernet 800G uses a higher baud rate for transmission and has a higher pre-correction bit error rate. The coding scheme in which two FEC codewords are concatenated is used, so that error correction performance of the Ethernet can be improved to meet an error correction performance indicator of the Ethernet 800G.

The sending device may further process the second encoded data, and send processed data to a receiving device. Correspondingly, the receiving device receives the processed data.

A processing process may include: transmission through P PMA lanes, second interleaving, data modulation, or optical-to-electrical conversion. The processing process may alternatively include some of the foregoing processes. P is an even number greater than or equal to 2, or P is an integer power of 2. For example, a value of P may be 4, 8, 16, or 32.

With reference to the foregoing descriptions, the following describes some embodiments of this application.

In embodiments of this application, it may be assumed that construction of the first FEC codeword, namely, the RS codeword, is (544,514,10), where 514 is an information symbol bit length K1 of the first FEC codeword, and 544 is a code length N1 of the first FEC codeword. K1 is 514 symbols, N1 is 544 symbols, and 10 indicates that one symbol includes 10 bits. In other words, N1=5440 bits, and K1=5140 bits.

When the Ethernet uses the coding scheme in which two FEC codewords are concatenated, an architecture of an Ethernet layer may have the following several examples. Several example architectures of the Ethernet layer are applicable to the Ethernet 800G or even a higher-bandwidth network. The first FEC codeword is an RS-FEC codeword, and the second FEC codeword may be denoted as an inner-FEC codeword. The architecture of the Ethernet layer may include a MAC layer, a PCS layer, a PMA layer, and a PMD layer. The MAC layer and the PCS layer may be considered to be located on a device side, and the PMA layer and the PMD layer may be considered to be located on a module side. A device is a device at the transmit end. For example, the device may be a switch or a server. A module is an optical module used for optical communication. In embodiments of this application, an encoder component of the first FEC codeword is configured to complete encoding of the first FEC codeword, and an encoder component of the second FEC codeword is configured to complete encoding of the second FEC codeword. The encoder component of the first FEC codeword may also be denoted as an encoder of the first FEC codeword, an encoding module of the first FEC, an RS-FEC encoder, or an RS-FEC encoding module. The encoder component of the second FEC codeword may also be denoted as an encoder of the second FEC codeword, an encoding module of the second FEC, an inner-FEC encoder, or an inner-FEC encode module. When the second FEC codeword is a Hamming code (Hamming), the encoder component of the second FEC codeword may also be referred to as a Hamming code encoder or a Hamming code encoding module. When the second FEC codeword is a BCH code, the encoder component of the second FEC codeword may also be referred to as a BCH code encoder or a BCH code encoding module. The BCH code is (Bose, Ray-Chaudhuri, and Hocquenghem) code.

Figure 6A:
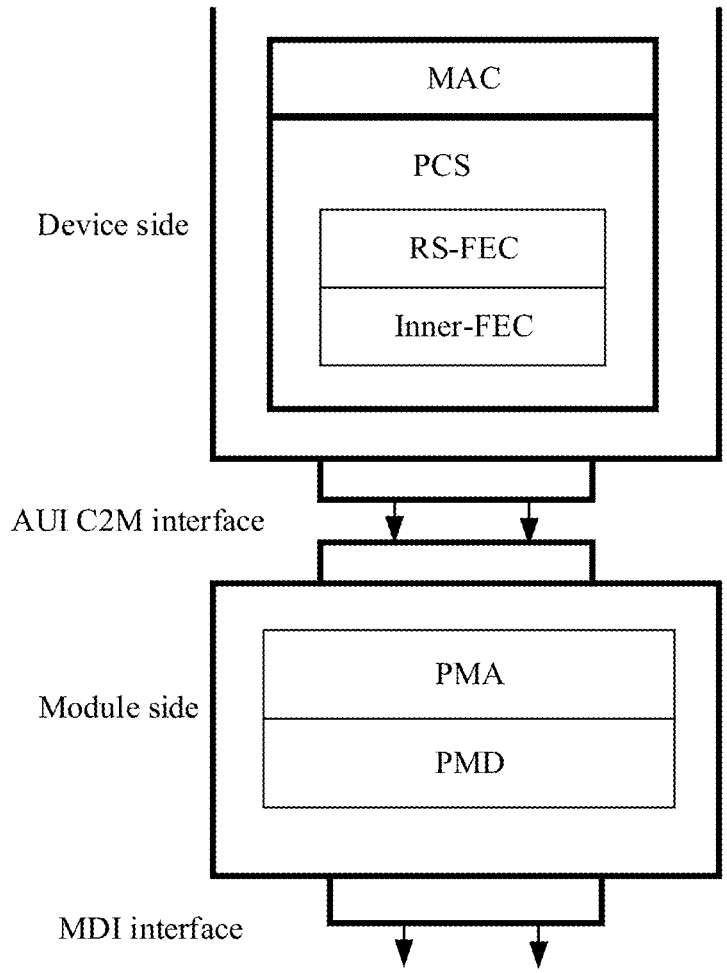
FIG. 6a is a schematic diagram of an Ethernet layer architecture 1 according to an embodiment of this application.

Architecture 1:

As shown in FIG. 6a, the encoder component of the second FEC codeword may be located at the PCS layer.

The encoder component of the inner-FEC codeword is added to the PCS layer on the device side. On the device side, RS-FEC encoding is performed on a data stream obtained sequentially through 64B/66B encoding, 256B/257B transcode, scramble, AM insertion, and 10-bit round robin distribution at the MAC layer and the PCS layer. The 64B/66B encoding may mean that a 64-bit data block is extended to a 66-bit information block. The 256B/257B transcode may be: sorting and splitting a 66-bit data block. A 25G service is used as an example. To-be-sent data is split into a plurality of 66-bit data blocks. Every four 66-bit data blocks are divided into one data block group (data segment), and each data block group is a 257-bit data block.

A data stream obtained through RS-FEC encoding enters the encoder component of the inner-FEC codeword. After being encoded by the encoder component of the inner-FEC codeword, the data stream enters the module side through an AUI C2M interface. After operations at the PMA and the PMD are completed on the module side, a data stream on the module side is transmitted to a medium layer through an MDI interface for transmission.

Figure 6B:
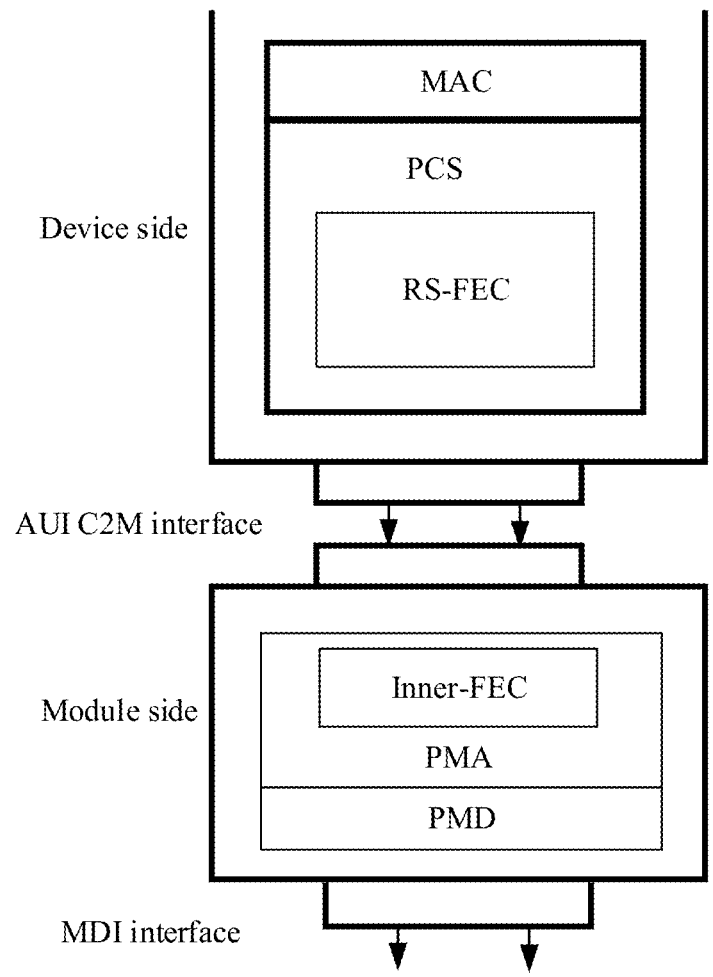
FIG. 6b is a schematic diagram of an Ethernet layer architecture 2 according to an embodiment of this application.

Architecture 2:

As shown in FIG. 6b, the encoder component of the second FEC codeword may be located at the PMA layer.

The encoder component of the inner-FEC codeword is added on the module side. On the device side, RS-FEC encoding is performed on a data stream obtained sequentially through 64B/66B encoding, 256B/257B transcode, scramble, AM insertion, and 10-bit round robin distribution at the MAC layer and the PCS layer. For processes of the 64B/66B encoding and the 256B/257B transcode, refer to the descriptions of the architecture 1.

A data stream obtained through RS-FEC encoding enters the module side through an AUI C2M interface. On the module side, the data stream enters the encoder component of the inner-FEC codeword. After the data stream is encoded by the encoder component of the inner-FEC codeword, operations at the PMA and the PMD are performed on the data stream. Then, a data stream on the module side is transmitted to a medium layer through an MDI interface for transmission.

It may be understood that the encoder component of the second FEC codeword may alternatively be located in another part of the Ethernet, and the foregoing architecture 1 and architecture 2 are merely examples.

The following describes data stream processing procedures based on the architecture 1 and the architecture 2.

Figure 7A:
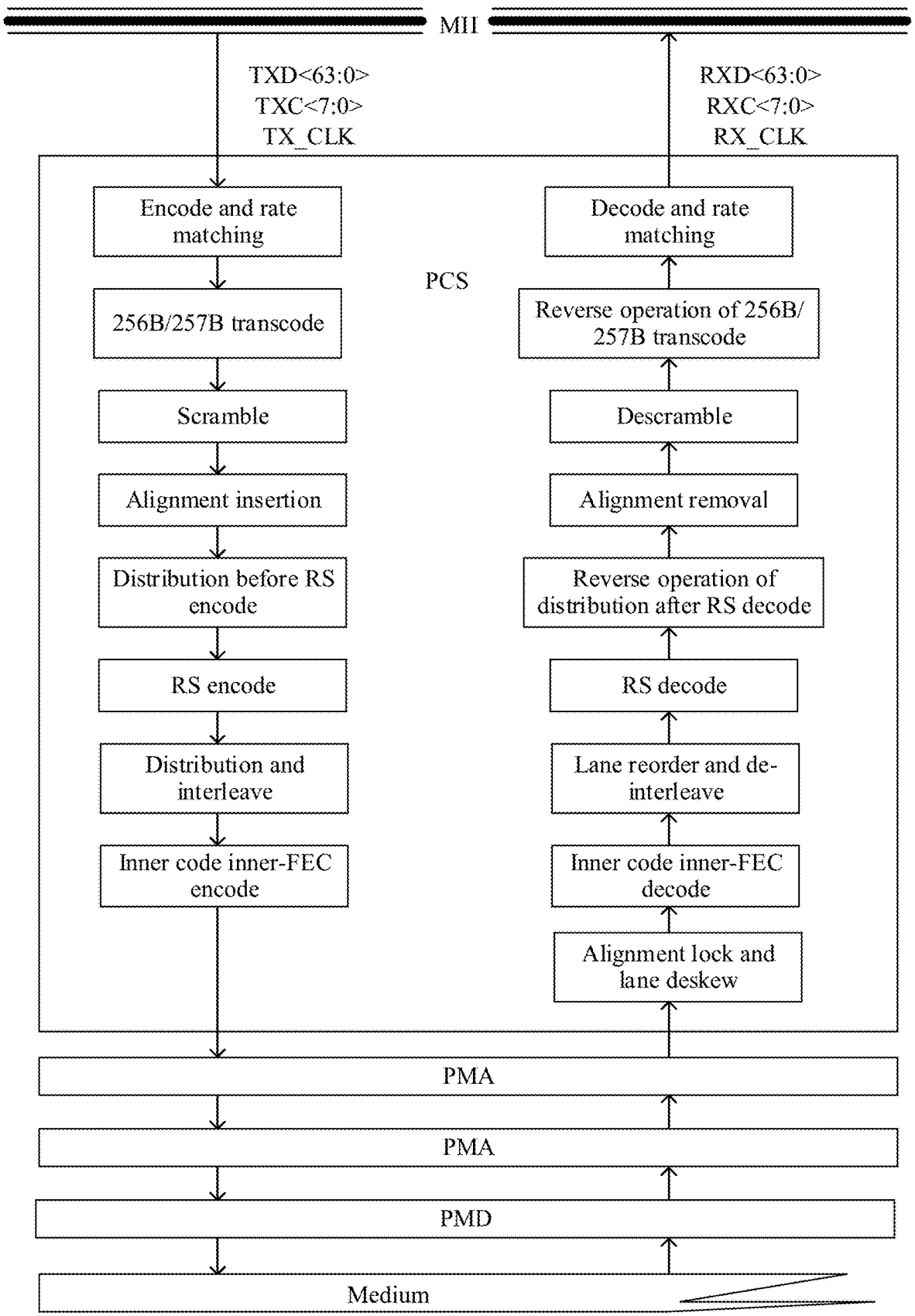
FIG. 7a is a schematic diagram of a data stream processing process corresponding to an architecture 1 according to an embodiment of this application.

Based on the architecture 1 shown in FIG. 6a, the encoder component of the second FEC codeword may be located at the PCS layer. As shown in FIG. 7a, the data stream processing process is described as follows: Data output from the MAC layer passes through the PCS layer, and encoding of the second FEC codeword, namely, inner-FEC encode, is completed at the PCS layer. Two data streams obtained through inner-FEC encode at the PCS layer are independently distributed to the PMA layer, and then combined into an 800G data stream at the PMA layer. The 800G data stream is sent to a receive end through a communication medium.

The data stream processing process is as follows: The data stream processing process includes a top-down data stream processing process at the transmit end and a bottom-up data stream processing process at the receive end.

A data stream at the transmit end is transmitted to the PCS layer through an MII interface. The PCS layer is compatible with the 100GE, 200GE, and 400GE standard protocols. After 9 main operation operations: encode and rate matching, 256B/257B transcode, scramble, alignment insertion, pre-FEC distribution, RS encode, distribution and interleave, processing at the PMA layer, and processing at the PMD layer are sequentially performed at the transmit end, a processed data stream is sent to the receive end through the communication medium.

The encode and rate matching is performed by a 64B/66B module. 64B/66B encoding is performed on a TXD<63:0> data block translated through the MII interface, and a throughput rate is adjusted based on TXC<7:0> of the MII interface. The 256B/257B transcode is transcoding from 256 bits to 257 bits. The scramble is a scramble operation. The alignment insertion is an alignment insertion operation. The pre-FEC distribution is a 10-bit round robin distribution operation before RS encode. The RS encode is an RS(544, 514,10) encoding operation. The distribution and interleave is 10-bit symbol distribution and symbol interleave after RS encode. The second FEC codeword encode, namely, the inner-FEC encode operation, is performed on a data stream obtained through the symbol distribution and the symbol interleaving. After the inner-FEC encode operation is complete, operations at the PMA and the PMD are performed on the data stream.

The receive end receives the data stream from the communication medium, and the receive end sequentially performs 11 main operations: processing at the PMD layer, processing at the PMA sublayer, alignment lock and lane deskew, inner-FEC decode, lane reorder and de-interleave, RS decode, post-FEC interleave, alignment removal, descramble, reverse transcode, and decode and rate matching. The 11 operations performed by the receive end are de-operations of the corresponding operations of the transmit end. The inner-FEC decode is a decoding operation of inner-FEC. The 11 operations performed by the receive end are de-operations of corresponding operations of the transmit end. The inner-FEC decode is a decoding operation of inner-FEC. The alignment lock and lane deskew is an alignment marker lock and lane deskew operation. The lane reorder and de-interleave is a lane reorder and de-interleave operation. The RS decode is an RS(544,514,10) decoding operation. The post-FEC interleave is a reverse operation of pre-FEC distribution after RS decode. The alignment removal is an operation of removing an alignment marker added by an encoder side. The descramble is a descramble operation. The reverse transcode is a reverse operation of 256B/257B transcode, to convert 257 bits into 256 bits. The decode and rate matching is a reverse operation of 64B/66B encoding and a throughput rate matching operation.

Figure 7B:
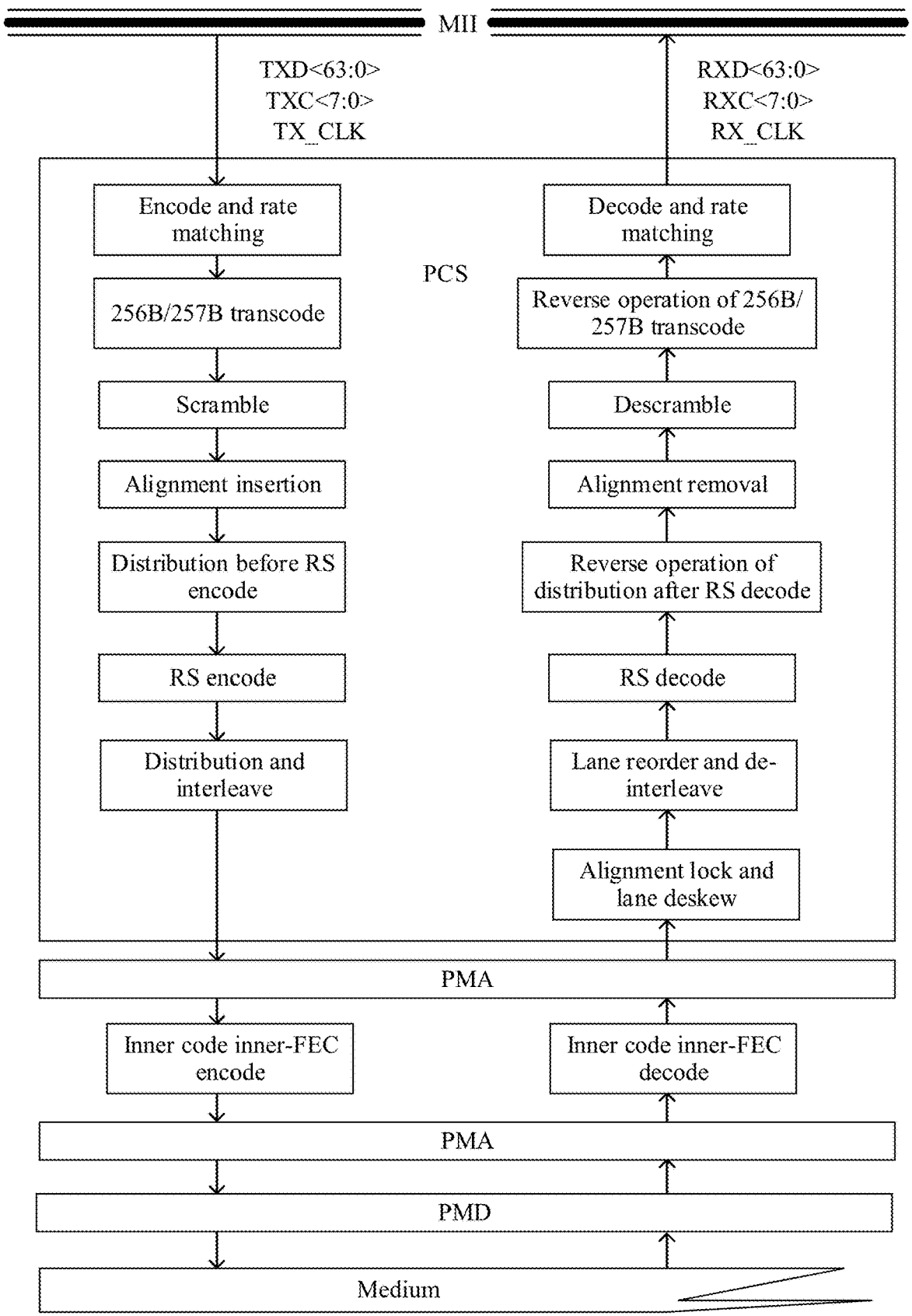
FIG. 7b is a schematic diagram of a data stream processing process corresponding to an architecture 2 according to an embodiment of this application.

Based on the architecture 2 shown in FIG. 6b, the encoder component of the second FEC codeword may be located at the PMA layer. As shown in FIG. 7b, the data stream processing process is described as follows: The data stream processing process includes a top-down data stream processing process at the transmit end and a bottom-up data stream processing process at the receive end.

A data stream at the transmit end is transmitted to the PCS layer through an MII interface. The PCS layer is compatible with the 100GE, 200GE, and 400GE standard protocols. After 10 operations: encode and rate matching, 256B/257B transcode, scramble, alignment insertion, pre-FEC distribution, RS encode, distribution and interleave, processing at the PMA layer, second FEC codeword encode (Inner-FEC Encode), and processing at the PMD layer are sequentially performed at the transmit end, a processed data stream is sent to the receive end through the communication medium.

The encode and rate matching is performed by a 64B/66B module. 64B/66B encoding is performed on a TXD<63:0> data block translated through the MII interface, and a throughput rate is adjusted based on TXC<7:0> of the MII interface. The 256B/257B transcode is transcoding from 256 bits to 257 bits. The scramble is a scramble operation. The alignment insertion is an alignment insertion operation. The pre-FEC distribution is a 10-bit round robin distribution operation before RS encode. The RS encode is an RS(544, 514,10) encoding operation. The distribution and interleave is 10-bit symbol distribution and symbol interleave after RS encode. The PMA is a next layer after the data stream passes through the PCS layer. An encoding operation, namely, an inner-FEC encode operation, of the second FEC codeword is performed on the data stream at the PMA layer.

The receive end receives the data stream from the communication medium, and the receive end sequentially performs 11 main operations: processing at the PMD layer, inner-FEC decode, processing at the PMA sublayer, alignment lock and lane deskew, lane reorder and de-interleave, RS decode, post FEC interleave, alignment removal, descramble, reverse transcode, and decode and rate matching. The 11 operations performed by the receive end are de-operations of the corresponding operations of the transmit end. The inner-FEC decode is a decoding operation of inner-FEC. The alignment lock and lane deskew is an alignment marker lock and lane deskew operation. The lane reorder and de-interleave is a lane reorder and de-interleave operation. The RS decode is an RS(544,514,10) decoding operation. The post-FEC interleave is a reverse operation of pre-FEC distribution after RS decode. The alignment removal is an operation of removing an alignment marker added by an encoder side. The descramble is a descramble operation. The reverse transcode is a reverse operation of 256B/257B transcode, to convert 257 bits into 256 bits. The decode and rate matching is a reverse operation of 64B/66B and a throughput rate matching operation.

It can be learned that, according to the Ethernet coding method provided in this embodiment of this application and the coding scheme in which the first FEC codeword and the second FEC codeword are concatenated, an outer code of a concatenated code uses the original standard RS codeword, and an inner code of the concatenated code uses the second FEC codeword, namely, the inner-FEC codeword. The coding method can be compatible with 100GE, 200GE, and 400GE Ethernet RS(544,514,10) coding, and entire FEC encoding overheads (OHs) are increased by using a coding method in which RS(544,514,10) and the inner-FEC codeword are concatenated. System link FEC encoding OHs are increased, which improves error correction performance of a system. In this way, a performance indicator of the next-generation high-speed Ethernet is met, a delay requirement of the next-generation Ethernet is met, and implementation costs are low.

The encoder component of the inner-FEC codeword may be disposed at the PCS layer, or may be disposed at the PMA layer. When the encoder component of the inner-FEC codeword is disposed at the PMA layer, RS encode at the PCS layer is decoupled from inner-FEC encode at the PMA layer, so that the inner-FEC encode at the PMA layer can be completed when inherent bit errors at a C2M optical/electrical interface are included. When the encoder component of the inner-FEC codeword is disposed at the PCS layer, the concatenated coding scheme can also be completed.

Under limitations of a device transmission rate and a system link budget, the second FEC codeword needs to meet some constraint conditions. In addition, to flexibly support and be compatible with most of 100GE, 200GE, and 400GE interface protocols in the IEEE 802.3 standard while meeting a requirement of a next-generation Ethernet technical indicator, the second FEC codeword also needs to meet some constraint conditions. In embodiments of this application, a code length of the second FEC codeword is represented by N, and an information bit length of the second FEC codeword is represented by K. $N=x*n$ and $K=x*k$, where x, n, and k are positive integers, and x is a common factor of N and K. The code length of the first FEC codeword is represented by N1, and the information bit length of the first FEC codeword is represented by K1. In a possible embodiment, a length of a FEC codeword may be long. When a construction parameter of the codeword is limited, a parameter of a finer granularity of codeword construction may be limited. For example, N=x×n and K=x×k. When the parameters N and K of the second FEC codeword are limited, n and k may be limited. A quantity of RS codewords used by the PCS layer of the Ethernet to perform RS-FEC encoding is represented by y. For example, one RS codeword is used for RS-FEC encoding of the 100GE Ethernet shown in FIG. 2, that is, y=1. For example, two RS codewords are used for RS-FEC encoding of the 200GE Ethernet shown in FIG. 3, that is, y=2. For example, two RS codewords are used for RS-FEC encoding of the 400GE Ethernet shown in FIG. 4, that is, y=2. Four RS codewords may be used for RS-FEC encoding of the 800G Ethernet.

Using an RS codeword means using an encoder component of the RS codeword.

It is assumed that the construction of the first FEC codeword, namely, the RS codeword, is (544,514,10), where 514 is an information bit length K1 of the first FEC codeword, and 544 is the code length N1 of the first FEC codeword. K1 is 514 symbols, N1 is 544 symbols, and 10 indicates that one symbol includes 10 bits. In other words, N1=5440 bits, and K1=5140 bits.

The following describes some embodiments related to the second FEC codeword.

The second FEC codeword meets any one or more of the following conditions 1 to 3.

Condition 1: The code length N and the information bit length K of the second FEC codeword satisfy the following formula (1):

$$M1 \times N/K \leq M2 \qquad \text{Formula(1), where}$$

M1 is a throughput of the first encoded data, and M2 is a throughput of the second encoded data.

The formula (1) may have formulas of a plurality of variants, for example, $M1/M2 \times K \leq 1$. For another example, $N/K \leq M2/M1$.

K is the information bit length, and N is the code length. It may be considered that K is an input before encoding, and N is an output after encoding. After a K-length information bit is encoded by using the second FEC codeword, N-length encoded data is obtained. M1 is a throughput of the first encoded data, the throughput of the first encoded data is used as an input of the second FEC codeword, and an output of the second FEC codeword cannot exceed M2.

M2 is a value determined based on one or more factors of a transceiver rate limitation, and bandwidth and transmission performance limitations of optical components in the Ethernet, and may be considered as a throughput of the second encoded data. M2 may alternatively be considered as an output data throughput at the PMD layer.

M1 and M2 may be in units of Gbps. Values of M1 and M2 may be: M1=106.25 Gbps, and M2=114 Gbps. In other words, the formula (1) is changed to 106.25×N/K≤114 Gbps. 106.25 Gbps is a throughput of a single lane output data stream at the PCS layer.

The Ethernet uses a 156.25 MHz reference clock as a reference and uses a PLL to extract and recover the clock. A phase-locked synchronization process of the PLL is adjusted by using a reference clock multiplier (RCM) as a lattice point. A data stream at the MAC layer is transmitted to the PCS layer by using a PCS physical lane at a bit width of 64 bits. 64B/66B encoding is first performed on the data stream at the PCS layer, and then 256B/257B transcode is completed based on four times of 64B/66B encoding. FEC encoding of RS(544,514,10) is performed on 20 transcoded data blocks. After 64B/66B encoding, 256B/257B transcode, and RS encode are performed at the PCS layer, a data throughput of each 100 Gbps input at the MAC layer to the PCS layer is 106.25 Gbps output by a single lane at the PCS layer. Due to the bandwidth and transmission performance limitations of the optical components, a data throughput output at the PMD layer cannot exceed M2 Gbps. In some embodiments, M2=114 Gbps.

Condition 2: K further satisfies the following condition: is a positive integer, and N1 is the code length of the first FEC codeword.

It can be learned from the concatenated coding scheme in the embodiment in FIG. 5 that an output of the first FEC codeword is used as an input of the second FEC codeword. N1 is the code length of the first FEC codeword, and may be considered as the output of the first FEC codeword. The second FEC codeword is input and encoded in a unit of K. Therefore, when N2 is set to a positive integer multiple of K, the output of the first FEC codeword (namely, the input of the second FEC codeword) may be equally divided into integral parts. Each part is K, and each input does not need to be filled with bits. In this way, the coding scheme in which the first FEC codeword and the second FEC codeword are concatenated is simpler and easier to implement, and has low complexity.

When N1=5440 bits, the condition 2 may be converted into the following condition: 5440/K is a positive integer.

K=x×k is substituted into N1/K to obtain N1/x×k, where N1/x×k a positive integer. When N1=5440 bits, N1/x×k is converted into 5440/x×k, where 5440/x×k is a positive integer.

A quantity of RS codewords used by the PCS layer of the Ethernet to perform RS-FEC encoding is y. An output codeword length of one RS codeword is N1, and therefore an output codeword length of y RS codewords is y×N1. Actually, outputs of the y RS codewords are an input of the second FEC codeword, in other words, the input of the second FEC codeword is y×N1. If it is required that the input of the second FEC codeword can be exactly divided by K, it is actually required that y×N1 can be exactly divided by K, that is, y×N1/K is a positive integer, or y×N1/x×k is a positive integer.

If a value of y is set to 1, N1/K is a positive integer. When the value of y is set to 1, in other words, when one RS codeword is used for the PCS layer of the Ethernet to perform RS-FEC encoding, if the output of the RS codeword (namely, the input of the second FEC codeword) can be exactly divided by K, an output of the y RS codewords (namely, the input of the second FEC codeword) can be exactly divided by K when the value of y is 2 or any other integer value. Therefore, in embodiments of this application, the value of y is set to 1, to obtain the constraint condition 2 that N1/K is a positive integer.

If the value of y is set to 1, it indicates that the PCS layer performs data block division at a granularity of one RS(544, 514,10). The information bit length of the inner-FEC can exactly divide one RS(544,514,10) codeword. Therefore, the quantity of RS codewords is an integer multiple of a length of one RS(544,514,10). Because a quantity of RS codewords at the PCS layer of 100GE is 1, a quantity of RS codewords at the PCS layer of each of 200GE and 400GE is 2, to implement an Ethernet PCS layer at a granularity of 100 Gbps, the value of y is set to 1 in a codeword constraint. For the next-generation 800G Ethernet, the value of y may be set to 4.

Condition 3: N and K further satisfy the following condition: M1×N/K=reference clock×L, where L is a positive integer. For example, L=4×RCM.

When the architecture of the Ethernet is the architecture 1, the encoder component of the second FEC codeword may be located at the PCS layer, and the second FEC codeword further meets the condition 3.

For example, in a process of transmitting a data stream of each 100 Gbps, the data stream of each 100 Gbps is adjusted by using a 156.25 MHz RCM as a lattice point, to perform serial-to-parallel conversion. Four data streams are combined into one data stream, and the data stream is transmitted on one transmission lane in a serial manner. Therefore, the second FEC codeword, namely, the inner-FEC codeword, meets: 106.25×N/K=156.25×W, where W is a positive integer; or meet 106.25 Gbps×N/K=1 bit×156.25 MHz×W, where W is a positive integer.

An Ethernet coding scheme corresponding to the second FEC codeword that meets the condition 3 can make implementation of Ethernet clock extraction and synchronization simpler. Only when W is an integer, the PLL can be adjusted in an entire lattice point. In this way, phase locking of the PLL can be completed more quickly, is easy to implement, and has low complexity.

In some embodiments, when the encoder component of the second FEC codeword is disposed at the PMA layer, the second FEC codeword may meet at least one of the condition 1 and the condition 2, and may not meet the condition 3. When the encoder component of the second FEC codeword is disposed at the PCS layer, the second FEC codeword may meet at least one of the condition 1, the condition 2, and the condition 3.

In a possible embodiment, in this embodiment of this application, a condition 4 is further set for the second FEC codeword.

Condition 4: N/K=18/17 or K/N=17/18, or some other variants, for example, x×n/x×k=18/17, that is, n/k=18/17; or x×k/x×n=17/18.

The following provides some possible second FEC codewords.

Construction of the second FEC codeword is (N,K,m), where N is a quantity of bits included in the second FEC codeword, K is a quantity of bits included in an information bit, and m is an order of a Galois field in which the FEC codeword is located.

When the condition 4 is met, n/k=18/17. The second FEC codeword includes any one of the following codewords, includes a spatially coupled code constructed by using any one of the following codewords as a subcode, or includes a multi-level code (MLC) constructed by using any one of the following codewords as a subcode:
(1) The codeword is a Hamming code (Hamming)(144, 136,8), where x=8, N=144, K=136, and OH=5.88%.
(2) The codeword is Hamming(180,170,10), where x=10, N=180, K=170, and OH=5.88%.
(3) The codeword is an extended Hamming code (eHamming)(180,170,9), where x=10, N=180, K=170, and OH=5.88%.
(4) The codeword is a double extended Hamming code (DE-Hamming)(180,170,8), where x=10, N=180, K=170, and OH=5.88%.
(5) The codeword is BCH(360,340,10), where x=20, N=360, K=340, and OH=5.88%.
(6) The codeword is DE-BCH(360,340,9), where x=20, N=360, K=340, and OH=5.88%.
(7) The codeword is DE-BCH(576,544,10), where x=32, N=576, K=544, and OH=5.88%.
(8) The codeword is BCH(594,561,11), where x=33, N=594, K=561, and OH=5.88%.

On the basis of determining the codeword construction parameters N, K, and m, OH may be determined.

The codeword (1) to the codeword (8) meet the condition 1, the condition 2, the condition 3, and the condition 4.

In some embodiments, the second FEC codeword may further include any one of the following codewords, include a spatially coupled code constructed by using any one of the following codewords as a subcode, or include a multi-level code constructed by using any one of the following codewords as a subcode:
(1) Hamming(126,119,7), where x=7, OH =5.88%, N=126, and K=119,
(2) Hamming(127,119,8), where x=7, OH =6.72%, N=127, and K=119,
(3) Hamming(145,136,9), where x=8, OH =6.62%, N=144, and K=136,
(4) Hamming(179,170,9), where x=10, OH=5.29%, N=179, and K=170,
(5) eHamming(127,119,7), where x=7, OH =6.72%, N=127, and K=119,
(6) eHamming(145,136,8), where x=8, OH =6.62%, N: 145, and K=136,
(7) eHamming(179,170,8), where x=10, OH=5.29%, N=179, and K=170,
(8) eHamming(181,170,10), where x=10, OH=6.47%, N=181, and K=170,
(9) BCH(290,272,9), where x=16, OH=6.62%, N=290, and K=272,
(10) BCH(358,340,9), where x=20, OH=5.29%, N=358, and K=340,
(11) BCH(574,544,10), where x=32, OH=5.51%, N=574, and K=544,
(12) Extended BCH code eBCH(291,272,9), where x=16, OH=6.99%, N=291, and K=272,
(13) eBCH(359,340,9), where x=20, OH=5.59%, N=359, and K=340,
(14) eBCH(361,340,10), where x=20, OH=6.18%, N=361, and K=340;
(15) eBCH(575,544,10), where x=32, OH=5.70%, N=575, and K=544, and
(16) DE-BCH(362,340,10), where x=20, OH=6.47%, N=362, and K=340.

The codewords (1) to (16) meet the condition 1 and the condition 2.

The foregoing codewords are merely examples, and there may be more codewords that meet the conditions in actual application. In an embodiment of the second FEC codeword, error correction performance is improved by increasing overheads (OHs) of FEC encoding of a system. If the Ethernet continues to evolve to 1.6 Tbps, the foregoing constraint conditions of the concatenated coding scheme provided in this embodiment of this application and the inner code in the concatenated scheme are still applicable.

With reference to the 100GE, 200GE, and 400GE Ethernet layer architectures respectively shown in FIG. 2, FIG. 3, and FIG. 4, the following provides several possible examples of an 800G (or 800GE) Ethernet layer architecture.

Figure 8:
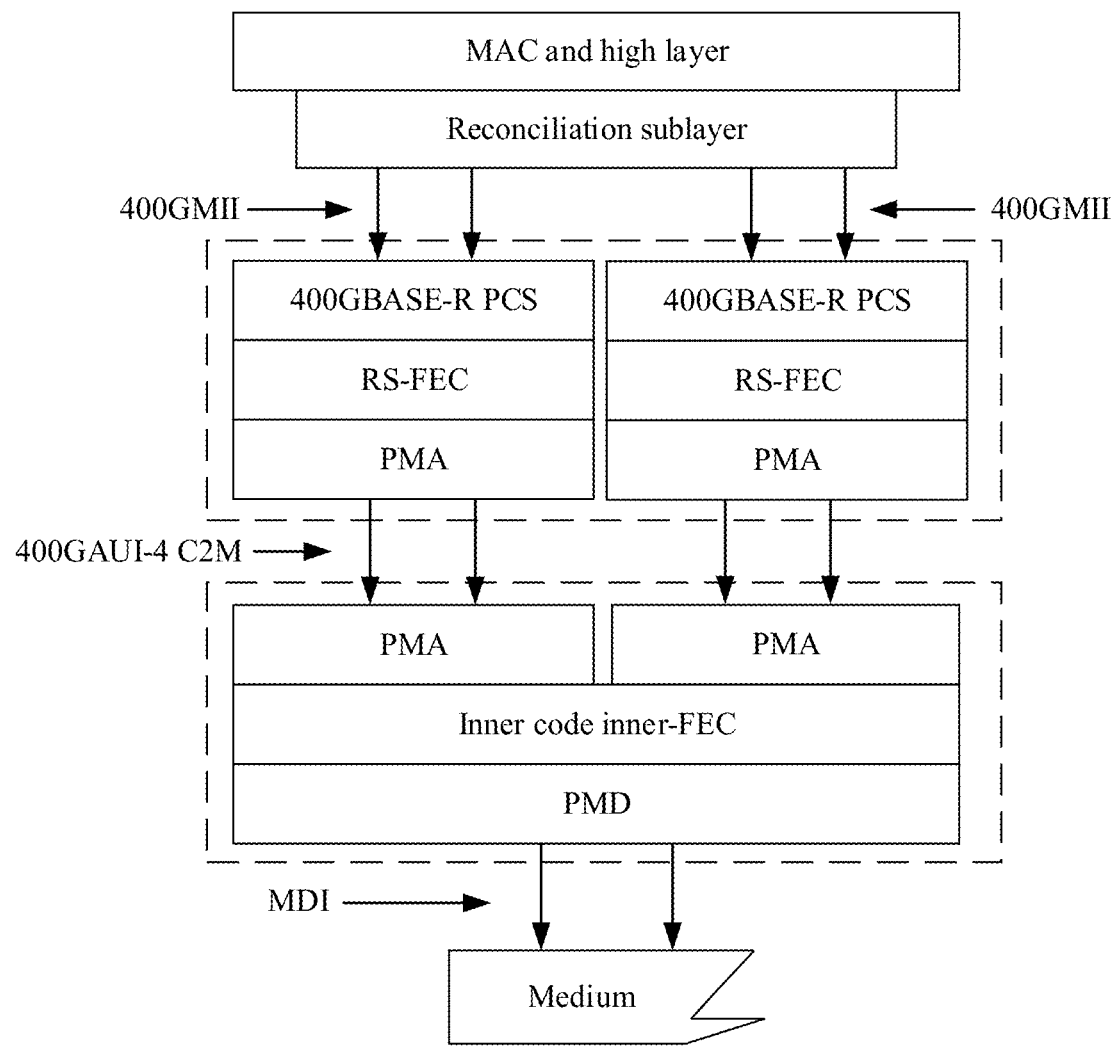
FIG. 8 is a schematic diagram of an 800G Ethernet layer architecture according to an embodiment of this application.

Example 1: As shown in FIG. 8, two 400GE Ethernet layer architectures may be combined into the 800G Ethernet layer in parallel. It can be learned from the 400GE Ethernet layer architecture shown in FIG. 4 that two RS codewords are used for RS-FEC encoding at the 400GE Ethernet PCS layer, and therefore four RS codewords are used for RS-FEC encoding at an 800GE Ethernet PCS layer.

Example 2: Four 200GE Ethernet layer architectures may alternatively be combined into the 800G Ethernet layer in parallel. It can be learned from the 200GE Ethernet layer architecture shown in FIG. 3 that two RS codewords are used for RS-FEC encoding at the 200GE Ethernet PCS layer, and therefore eight RS codewords are used for RS-FEC encoding at an 800GE Ethernet PCS layer.

Example 3: Eight 100GE Ethernet layer architectures may alternatively be combined into the 800G Ethernet layer in parallel. It can be learned from the 100GE Ethernet layer architecture shown in FIG. 2 that one RS codeword is used for RS-FEC encoding at the 100GE Ethernet PCS layer, and therefore eight RS codewords are used for RS-FEC encoding at an 800GE Ethernet PCS layer.

Example 4: Four 100GE Ethernet layer architectures and one 400GE Ethernet layer architecture may alternatively be combined into the 800G Ethernet layer in parallel. It can be learned from the 100GE Ethernet layer architecture shown in FIG. 2 and the 400GE Ethernet layer architecture shown in FIG. 4 that one RS codeword is used for RS-FEC encoding at the 100GE Ethernet PCS layer and two RS codewords are used for RS-FEC encoding at the 400GE Ethernet PCS layer, and therefore six RS codewords are used for RS-FEC encoding at an 800GE Ethernet PCS layer.

Example 5: Two 200GE Ethernet layer architectures and one 400GE Ethernet layer architecture may alternatively be combined into the 800G Ethernet layer in parallel. It can be learned from the 200GE Ethernet layer architecture shown in FIG. 3 and the 400GE Ethernet layer architecture shown in FIG. 4 that two RS codewords are used for RS-FEC encoding at the 200GE Ethernet PCS layer and two RS codewords are used for RS-FEC encoding at the 400GE Ethernet PCS layer, and therefore six RS codewords are used for RS-FEC encoding at an 800GE Ethernet PCS layer.

Example 6: Six 100GE Ethernet layer architectures and one 200GE Ethernet layer architecture may alternatively be combined into the 800G Ethernet layer in parallel. It can be learned from the 100GE Ethernet layer architecture shown in FIG. 2 and the 400GE Ethernet layer architecture shown in FIG. 4 that one RS codeword is used for RS-FEC encoding at the 100GE Ethernet PCS layer and two RS codewords are used for RS-FEC encoding at the 400GE Ethernet PCS layer, and therefore eight RS codewords are used for RS-FEC encoding at an 800GE Ethernet PCS layer.

In the foregoing Example 1 to Example 6, a quantity of RS codewords used for RS-FEC encoding at the 800GE Ethernet PCS layer is obtained in a mode in which a parallel architecture constituting the Ethernet layer is compatible, and the quantity of RS codewords is variable in an incompatible mode.

Schematic diagrams of the 800GE Ethernet constituted by parallel architectures in Example 2 to Example 6 can be obtained by analogy by referring to Example 1.

It may be understood that, with evolution of the system, the solution in this embodiment of this application is further applicable to one 800G Ethernet layer architecture, instead of an 800G Ethernet layer architecture constituted by combining a plurality of architectures in parallel.

The following uses Example 1 as an example to further describe the data stream processing procedure in detail based on the architecture 1 shown in FIG. 6a and the procedure shown in FIG. 7a.

The 800G Ethernet PCS layer is constituted by two 400GE PCS layers, and the encoder component of the second FEC codeword (inner-FEC codeword) may be located at the PCS layer. An 800G data stream is divided into two 400G data streams at the PCS layer. An operation procedure of each 400G data stream is the same as that of the data stream at the 400GE PCS layer shown in FIG. 7a. A data stream obtained through AM insertion, RS encode at two flows, multiplexing of two RS(544,514,10) codewords, and 10-bit symbol distribution enters the encoder (Inner-FEC encoder for short) of the inner-FEC codeword for encoding. The data stream is divided into data blocks with a length of K bits, and a length of each of the data blocks encoded by the inner-FEC encoder are N bits. The inner-FEC encoder encodes the data blocks with K bits into data blocks with N bits. A data stream encoded by the inner-FEC encoder enters the PMA. Multiplexing and 10-bit symbol distribution operations are performed again on the data stream entering the PMA layer. Four RS(544,514,10) codewords are used for the multiplexing and 10-bit symbol distribution operations herein. 2-bit interleaving is implemented at the PMA layer. An interleaved data stream is distributed to the PMD by bit, and modulation and electro-optical conversion are performed on the interleaved data stream at the PMD.

The following uses Example 1 as an example to further describe the data stream processing procedure in detail based on the architecture 2 shown in FIG. 6b and the procedure shown in FIG. 7b.

The 800G Ethernet PCS layer is constituted by two 400GE PCS layers, and the encoder component of the second FEC codeword may be located at the PMA layer. An 800G data stream is divided into two 400G data streams at the PCS layer. An operation procedure of each 400G data stream is the same as that of the data stream at the 400GE PCS layer described in FIG. 7b. A data stream obtained through AM insertion, RS encode at two flows, multiplexing of two RS(544,514,10) codewords, and 10-bit symbol distribution enters the PMA. Multiplexing and 10-bit symbol distribution operations are performed again on the data stream entering the PMA layer. Four RS(544,514,10) codewords are used for the multiplexing and 10-bit symbol distribution operations herein. A data stream obtained through multiplexing and 10-bit symbol distribution at the PMA layer enters the encoder of the inner-FEC codeword (Inner-FEC encoder for short) for encoding. The data stream is divided into data blocks with a length of K bits, and data blocks encoded by the inner-FEC encoder are N bits. The inner-FEC encoder encodes the data blocks with K bits into N bits. 2-bit interleaving is performed on a data stream encoded by the inner-FEC encoder at the PMA layer. An interleaved data stream is distributed to the PMD by bit, and modulation and electro-optical conversion are performed on the interleaved data stream at the PMD.

In embodiments of this application, the coding scheme in which the first FEC codeword and the second FEC codeword are concatenated is used, where the first FEC codeword is an outer code, and the second FEC codeword is an inner code. As described in the embodiment in FIG. 5, the transmit end first encodes the first to-be-encoded information by using the first FEC codeword, and then encodes the first encoded data by using the second FEC codeword. Considering sufficient mixing of data input into the second FEC codeword, this embodiment of this application provides a method, to add an interleaving operation to the concatenated coding scheme.

After the interleaving operation is added, S501 in the embodiment in FIG. 5 may be described as follows: In S501, the transmit end performs FEC encoding on the first to-be-encoded information by using y first FEC codewords, to obtain y groups of encoded data, where y is an even number greater than or equal to 2; and the transmit end performs first interleaving on the y groups of encoded data to obtain the first encoded data.

Alternatively, after the interleaving operation is added, S501 and S502 in the embodiment in FIG. 5 may be described as follows: In S501, that the transmit end encodes first to-be-encoded information by using a first FEC codeword, to obtain first encoded data includes the following operation: The transmit end performs FEC encoding on the first to-be-encoded information by using y first FEC codewords, to obtain y groups of first encoded data. In S502, that the transmit end encodes the first encoded data by using the second FEC codeword actually includes the following operations: The transmit end performs first interleaving on the y groups of first encoded data, and encodes, by using the second FEC codeword, first encoded data obtained through the first interleaving.

For the descriptions of S501 and S502 after interleaving are added, actual operation processes are the same, but text descriptions are different.

The first interleaving meets an interleaving matrix in which quantities of rows and columns are respectively L and P, in other words, the transmit end interleaves the y groups of encoded data by using the interleaving matrix. The interleaving matrix may also be referred to as an interleaving pattern, and interleaving is performed based on the interleaving matrix or the interleaving pattern in a process of interleaving the y groups of encoded data, where L and P are even numbers greater than or equal to 2, and P is a quantity of PMA lanes. The PMA lane may be a real lane, or may be a virtual lane. For example, a value of P may be an integer power of 2. For example, the value of P may be 4, 8, 16, or 32.

After encoding is performed by using the first FEC codeword, the PMA lane is used for outputting, and the encoder of the second FEC codeword is entered for encoding. After the interleaving operation is added, procedures of encoding, interleaving, and output through the PMA lane may be implemented by using the following procedures. Several procedures are changed in a sequence of encoding, interleaving, and output through the PMA lane.

Procedure 1:

The transmit end encodes the first to-be-encoded information by using the first FEC codeword, to obtain y groups of encoded data. The transmit end performs first interleaving on the y groups of encoded data, to obtain the first encoded data. The transmit end transmits the first encoded data through P PMA lanes; and encodes, by using the second FEC codeword, the first encoded data transmitted through the P PMA lanes, to the obtain second encoded data.

Procedure 2:

The transmit end encodes the first to-be-encoded information by using the first FEC codeword, to obtain y groups of encoded data. The transmit end transmits the y groups of encoded data through P PMA lanes; and performs first interleaving on the y groups of encoded data transmitted through the P PMA lanes, to obtain the first encoded data. The transmit end encodes, by using the second FEC codeword, the first encoded data transmitted through the P PMA lanes, to obtain second encoded data.

Procedure 3: The transmit end encodes the first to-be-encoded information by using the first FEC codeword, to obtain y groups of encoded data. The transmit end performs first interleaving on the y groups of encoded data to obtain the first encoded data. The transmit end encodes the first encoded data by using the second FEC codeword, to obtain the second encoded data. The transmit end transmits the second encoded data through P PMA lanes, and processes the second encoded data transmitted through the P PMA lanes. The transmit end may further send processed data to the receive end.

An interleaver of the first interleaving may be represented by $\pi_e$. The interleaver $\pi_e$ of the first interleaving may be an interleaver formed by a multiplexer (Mux) and a 10-bit symbol distributor (10-bit symbol distribution).

The foregoing procedure 1 is applicable to an Ethernet architecture in which the encoder component of the second FEC codeword is located at the PMA layer and the interleaver ne of the first interleaving is located at the PCS layer. The procedure 2 is applicable to an Ethernet architecture in which the encoder component of the second FEC codeword is located at the PMA layer and the interleaver ne of the first interleaving is located at the PMA layer. The procedure 3 is applicable to an Ethernet architecture in which the encoder component of the second FEC codeword is located at the PCS layer and the interleaver $\pi_e$ of the first interleaving is located at the PCS layer.

The first interleaving in the foregoing procedure 1 and procedure 3 complies with the following rules:

Row elements in a row of the interleaving matrix respectively correspond to data obtained from the y groups of encoded data in a round robin manner from left to right. For example, y=4, group numbers of four groups of encoded data are respectively a, b, c, and d, and row elements in a row of the interleaving matrix respectively correspond to data obtained from a, b, c, d, a, b, c, d, . . . , from left to right.

A same round robin rule is used for each of the L rows. For example, row elements in each row of the interleaving matrix respectively correspond to data obtained from a, b, c, d, a, b, c, d . . . , from left to right.

Alternatively, round robin rules are different for every consecutive y rows in the L rows. It is assumed that y=4. For example, a round robin rule of a first row in the L rows is: row elements in the first row of the interleaving matrix respectively correspond to data obtained from a, b, c, d, a, b, c, d . . . from left to right; a round robin rule of a second row in the L rows is: row elements in the second row of the interleaving matrix respectively correspond to data obtained from d, c, b, a, d, c, b, a . . . from left to right; a round robin rule of a third row in the L rows is: row elements in the third row of the interleaving matrix respectively correspond to data obtained from b, a, d, c, b, a, d, c, . . . from left to right; and a round robin rule of a fourth row in the L rows is: row elements in the fourth row of the interleaving matrix respectively correspond to data obtained from c, d, a, b, c, d, a, b, . . . from left to right. In this case, the round robin rules of the four consecutive rows, namely, the first row to the fourth row, in the L rows are different. Round robin rules of a fifth row to an eighth row in the L rows may be the same as the round robin rules of the first row to the fourth row respectively. Therefore, round robin rules of every four consecutive rows in the L rows are different. For example, the round robin rules of the fifth row to the eighth row in the L rows are different. For another example, round robin rules of the third row to the sixth row in the L rows are also different.

The first interleaving in the foregoing procedure 2 complies with the following rule:

The P PMA lanes correspond to sequence numbers 0 to (P−1), and the P columns of the interleaving matrix respectively one-to-one correspond to encoded data from the P PMA lanes. Row elements whose column sequence numbers are odd numbers in a row of the interleaving matrix respectively correspond to encoded data of PMA lanes whose sequence numbers are 0 to (P/2−1), and row elements whose column sequence numbers are even numbers in the row of the interleaving matrix respectively correspond to encoded data of PMA lanes whose sequence numbers are P/2 to P. Certainly, alternatively, row elements whose column sequence numbers are even numbers in a row of the interleaving matrix respectively correspond to encoded data of PMA lanes whose sequence numbers are 0 to (P/2−1), and row elements whose column sequence numbers are odd numbers in the row of the interleaving matrix respectively correspond to encoded data of PMA lanes whose sequence numbers are P/2 to P.

To better understand the foregoing procedures 1, 2, and 3 and the interleaving rules that each procedure complies with, the following uses Example 1 shown in FIG. 8 as an example, that is, the two 400GE Ethernet layer architectures are combined into an 800G Ethernet layer in parallel, to describe the foregoing procedures 1 to 3 and the interleaving rules in detail.

Figure 9:
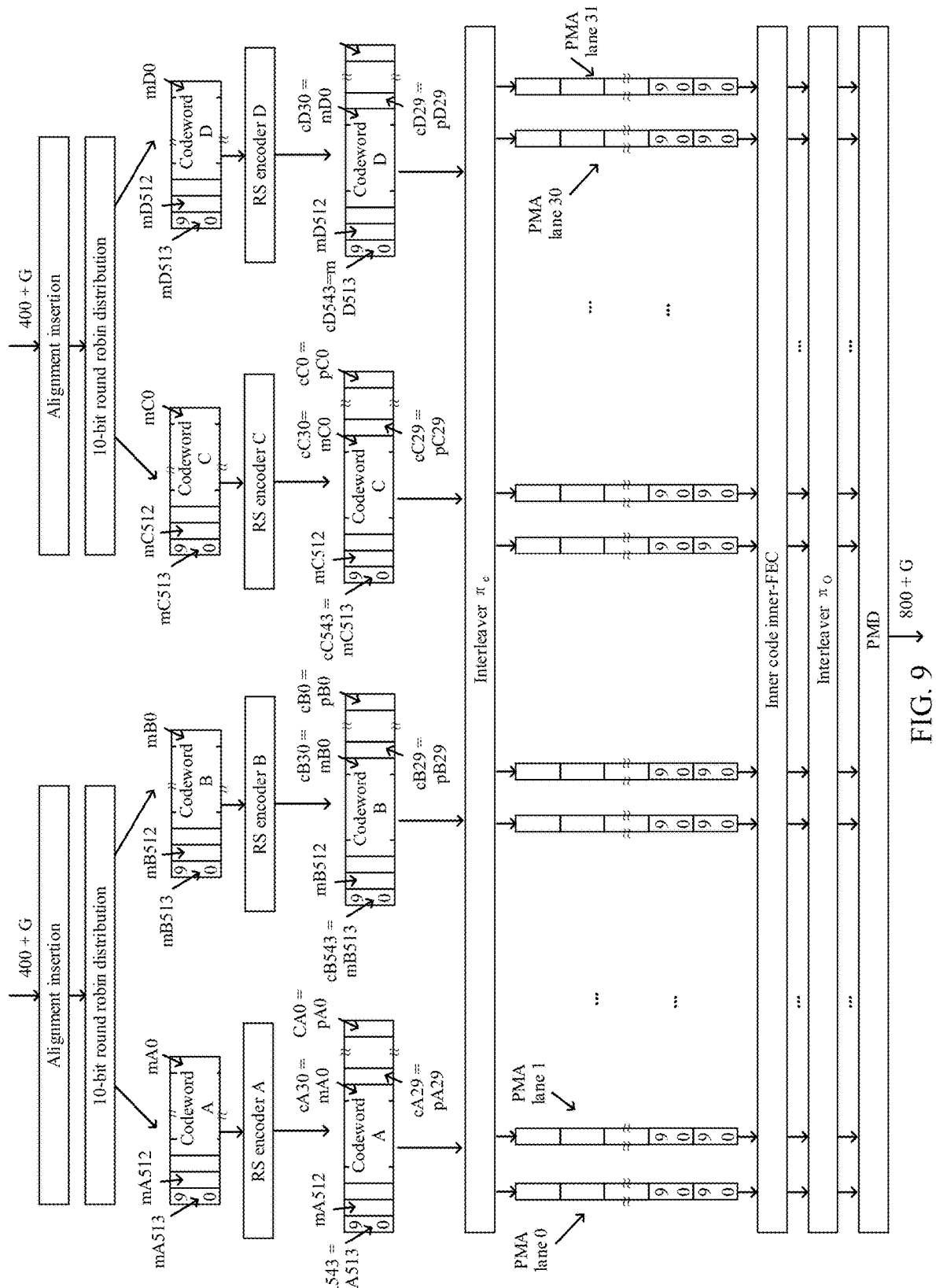
FIG. 9 is a schematic flowchart 1 of data processing according to an embodiment of this application.

With reference to the descriptions of the procedure 1, as shown in FIG. 9, a data processing procedure is described as follows:

Two 400 Gbps data streams enter alignment insertion (AM Insertion) modules. After alignment markers are inserted into the data streams, data streams are distributed to information symbols of RS codewords in a 10-bit round robin manner (10-bit round robin distribution). In FIG. 9, there are four RS codewords, which are denoted as a codeword A, a codeword B, a codeword C, and a codeword D respectively. A least significant 0 information symbol (a to-be-encoded symbol) of the codeword A is denoted as mA0, a least significant 1 information symbol of the codeword A is denoted as mA1, a most significant 512 information symbol of the codeword A is denoted as mA512, and a most significant 513 information symbol of the codeword A is denoted as mA513. Similarly, a least significant 0 information symbol of the codeword B is denoted as mB0, a least significant 1 information symbol of the codeword B is denoted as mB1, a most significant 512 information symbol of the codeword B is denoted as mB512, and a most significant 513 information symbol of the codeword B is denoted as mB513. A least significant 0 information symbol of the codeword C is denoted as mC0, a least significant 1 information symbol of the codeword C is denoted as mC1, a most significant 512 information symbol of the codeword C is denoted as mC512, and a most significant 513 information symbol of the codeword C is denoted as mC513. A least significant 0 information symbol of the codeword D is denoted as mD0, a least significant 1 information symbol of the codeword D is denoted as mD1, a most significant 512 information symbol of the codeword D is denoted as mD512, and a most significant 513 information symbol of the codeword D is denoted as mD513. After information symbols of the codewords A, B, C, and D are distributed, distributed information symbols are respectively sent to corresponding encoders: RS encoder A, RS encoder B, RS encoder C, and RS encoder D. After encoding of the codeword A is completed, a least significant 0 bit information symbol is denoted as cA0, and cA0 is also a parity symbol bit pA0, that is, cA0=pA0. After encoding of the codeword A is completed, a least significant 1 bit is denoted as cA1, and cA1 is also a parity symbol bit pA1, that is, cA1=pA1. After encoding of the codeword A is completed, a least significant 29 bit is denoted as cA29, and cA29 is also a parity symbol bit pA29, that is, cA29=pA29. After encoding of the codeword A is completed, a least significant 30 bit is denoted as cA30, and cA30 is also an information symbol bit mA0, that is, cA30=mA0. After encoding of the codeword A is completed, a least significant 31 bit is denoted as cA31, and cA31 is also an information symbol bit mA1, that is, cA31=mA1. After encoding of the codeword A is completed, a most significant 543 bit is denoted as cA543, and cA543 is also an information symbol bit mA513, that is, cA543=mA513. After encoding of the codeword B is completed, a least significant 0 bit is denoted as cB0, and cB0 is also a parity symbol bit pB0, that is, cB0=pB0. After encoding of the codeword B is completed, a least significant 1 bit is denoted as cB1, and cB1 is also a parity symbol bit pB1, that is, cB1=pB1. After encoding of the codeword B is completed, a least significant 29 bit is denoted as cB29, and cB29 is also a parity symbol bit pB29, that is, cB29=pB29. After encoding of the codeword B is completed, a least significant 30 bit is denoted as cB30, and cB30 is also an information symbol bit mB0, that is, cB30=mB0. After encoding of the codeword B is completed, a least significant 31 bit is denoted as cB31, and cB31 is also an information symbol bit mB1, that is, cB31=mB1. After encoding of the codeword B is completed, a most significant 543 bit is denoted as cB543, and cB543 is also an information symbol bit mB513, that is, cB543=mB513. After encoding of the codeword C is completed, a least significant 0 bit is denoted as cC0, and cC0 is also a parity symbol bit pC0, that is, cC0=pC0. After encoding of the codeword C is completed, a least significant 1 bit is denoted as cC1, and cC1 is also a parity symbol bit pC1, that is, cC1=pC1. After encoding of the codeword C is completed, a least significant 29 bit is denoted as cC29, and cC29 is also a parity symbol bit pC29, that is, cC29=pC29. After encoding of the codeword C is completed, a least significant 30 bit is denoted as cC30, and cC30 is also an information symbol bit mC0, that is, cC30=mC0. After encoding of the codeword C is completed, a least significant 31 bit is denoted as cC31, and cC31 is also an information symbol bit mC1, that is, cC31=mC1. After encoding of the codeword C is completed, a most significant 543 bit is denoted as cC543, and cC543 is also an information symbol bit mC513, that is, cC543=mC513. After encoding of the codeword D is completed, a least significant 0 bit is denoted as cD0, and cD0 is also a parity symbol bit pD0, that is, cD0=pD0. After encoding of the codeword D is completed, a least significant 1 bit is denoted as cD1, and cD1 is also a parity symbol bit pD1, that is, cD1=pD1. After encoding of the codeword D is completed, a least significant 29 bit is denoted as cD29, and cD29 is also a parity symbol bit pD29, that is, cD29=pD29. After encoding of the codeword D is completed, a least significant 30 bit is denoted as cD30, and cD30 is also an information symbol bit mD0, that is, cD30=mD0. After encoding of the codeword D is completed, a least significant 31 bit is denoted as cD31, and cD31 is also an information symbol bit mD1, that is, cD31=mD1. After encoding of the codeword D is completed, a most significant 543 bit is denoted as cD543, and cD543 is also an information symbol bit mD513, that is, cD543=mD513. Encoding procedures of the codeword A, the codeword B, the codeword C, and the codeword D may correspond to the embodiment in FIG. 5. The y pieces of to-be-encoded information is encoded by using the first FEC codeword, to obtain the y groups of encoded data. The value of y is 4.

After the interleaver rce interleaves the four groups of encoded data at the PCS layer, concatenated encoding of the second FEC codeword is performed on a data stream at the PMA layer through an optical/electrical interface C2M or through the P PMA lanes. An encoded codeword is the second FEC codeword, namely, the inner-FEC codeword.

There are P PMA lanes in the architecture shown in FIG. 9, where P=32, namely, 32 columns of PMA lanes, j indicates a quantity of symbols of each RS codeword included in a row of each PMA lane, and L indicates a quantity of rows of the PMA lane. cA<543−8L−j> indicates a (543−8L−j)$^{th}$ symbol bit of the RS codeword A on the left side of FIG. 9, cB<543−8L−j> indicates a (543−8L−j)$^{th}$ symbol bit of the RS codeword B on the left side of FIG. 9, cC<543−8L−j> indicates a (543−8L−j)$^{th}$ symbol bit of the RS codeword C on the right side of FIG. 9, and cD<543−8L−j> indicates a (543−8L−j)$^{th}$ symbol bit of the RS codeword D on the right side of FIG. 9. tx_out indicates a data stream output by the interleaver at a symbol granularity. tx_out<32L+4j> indicates a (32L+4j)$^{th}$ symbol of the data stream output by the interleaver, tx_out<32L+4j+1> indicates a (32L+4j+1)$^{th}$ symbol of the data stream output by the interleaver, tx_out<32L+4j+2> indicates a (32L+4j+2)$^{th}$ symbol of the data stream output by the interleaver, and tx_out<32L+4j+3> indicates a (32L+4j+3) symbol of the data stream output by the interleaver.

Interleaving rules used by the interleaver $\pi_e$ may be, for example, the following interleaving rule 1, interleaving rule 2, interleaving rule 3, and interleaving rule 4.

The interleaving rule 1 is as follows: 32 symbols in first rows on 32 PMA lanes are successively distributed by the 4 RS codewords A, B, C, and D in a round robin manner, 32 symbols in second rows are successively distributed by the 4 RS codewords D, C, B, and A in a round robin manner, 32 symbols in third rows are successively distributed by the 4 RS codewords B, A, D, and C in a round robin manner, and 32 symbols in fourth rows are successively distributed by the four RS codewords C, D, A, and B in a round robin manner. Then, 10-bit distribution is performed on each row according to this rule.

The interleaving rule 1 of the interleaver $\pi_e$ may be expressed in a pseudo-code form as follows:

```
For all k=0 to 67
For all j=0 to 7
if (k%4==0)
tX_out<32k+4j>=cA<543-8k-j>
tX_out<32k+4j+1>=cB<543-8k-j>
tX_out<32k+4j+2>=cC<543-8k-j>
tX_out<32k+4j+3>=cD<543-8k-j>
else if (k%4==1)
tX_out<32k+4j>=cD<543-8k-j>
tX_out<32k+4j+1>=cC<543-8k-j>
tX_out<32k+4j+2>=cB<543-8k-j>
tX_out<32k+4j+3>=cA<543-8k-j>
else if (k%4==2)
tX_out<32k+4j>=cB<543-8k-j>
tX_out<32k+4j+1>=cA<543-8k-j>
tX_out<32k+4j+2>=cD<543-8k-j>
tX_out<32k+4j+3>=cC<543-8k-j>
else
tX_out<32k+4j >=cC<543-8k-j>
tX_out<32k+4j+1>=cD<543-8k-j>
tX_out<32k+4j+2>=cA<543-8k-j>
tX_out<32k+4j+3>=cB<543-8k-j>
```

The interleaving rule 2 is as follows:

32 symbols in first rows on the 32 PMA lanes are successively distributed by the 4 RS codewords A, B, C, and D in a round robin manner, 32 symbols in second rows are successively distributed by the 4 RS codewords B, A, D, and C in a round robin manner, 32 symbols in third rows are successively distributed by the 4 RS codewords C, D, A, and B in a round robin manner, and 32 symbols in fourth rows are successively distributed by the four RS codewords D, C, B, and A in a round robin manner. Then, 10-bit distribution is performed on each row according to this rule. The interleaving rule of the interleaver may be expressed in a pseudo-code form as follows:

```
For all k=0 to 67
For all j=0 to 7
if (k%4==0)
tX_out<32k+4j>=cA<543-8k-j>
tX_out<32k+4j+1>=cB<543-8k-j>
tX_out<32k+4j+2>=cC<543-8k-j>
tX_out<32k+4j+3>=cD<543-8k-j>
else if (k%4==1)
tX_out<32k+4j>=cB<543-8k-j>
tX_out<32k+4j+1>=cA<543-8k-j>
tX_out<32k+4j+2>=cD<543-8k-j>
tX_out<32k+4j+3>=cC<543-8k-j>
else if (k%4==2)
tX_out<32k+4j>=cC<543-8k-j>
tX_out<32k+4j+1>=cD<543-8k-j>
tX_out<32k+4j+2>=cA<543-8k-j>
tX_out<32k+4j+3>=cB<543-8k-j>
else
tX_out<32k+4j>=cD<543-8k-j>
tX_out<32k+4j+1>=cC<543-8k-j>
tX_out<32k+4j+2>=cB<543-8k-j>
tX_out<32k+4j+3>=cA<543-8k-j>
```

The interleaving rule 3 is as follows: 32 symbols in first rows on the 32 PMA lanes are successively distributed by the 4 RS codewords A, B, C, and D in a round robin manner, 32 symbols in second rows are successively distributed by the 4 RS codewords C, D, A, and B in a round robin manner, 32 symbols in third rows are successively distributed by the 4 RS codewords B, A, D, and C in a round robin manner, and 32 symbols in fourth rows are successively distributed by the four RS codewords D, C, B, and A in a round robin manner. Then, 10-bit distribution is performed on each row according to this rule.

The interleaving rule 3 of the interleaver may be expressed in a pseudo-code form as follows:

```
For all k=0 to 67
For all j=0 to 7
if (k%4==0)
tX_out<32k+4j>=cA<543-8k-j>
tX_out<32k+4j+1>=cB<543-8k-j>
tX_out<32k+4j+2>=cC<543-8k-j>
tX_out<32k+4j+3>=cD<543-8k-j>
else if (k%4==1)
tX_out<32k+4j>=cC<543-8k-j>
tX_out<32k+4j+1>=cD<543-8k-j>
tX_out<32k+4j+2>=cA<543-8k-j>
tX_out<32k+4j+3>=cB<543-8k-j>
else if (k%4==2)
tX_out<32k+4j>=cB<543-8k-j>
tX_out<32k+4j+1>=cA<543-8k-j>
tX_out<32k+4j+2>=cD<543-8k-j>
tX_out<32k+4j+3>=cC<543-8k-j>
else
tX_out<32k+4j>=cD<543-8k-j>
tX_out<32k+4j+1>=cC<543-8k-j>
```

The interleaving rule 4 is as follows: 32 symbols in first rows on the 32 PMA lanes are successively distributed by the 4 RS codewords A, B, C, and D in a round robin manner, 32 symbols in second rows are successively distributed by the 4 RS codewords D, C, B, and A in a round robin manner, 32 symbols in third rows are successively distributed by the 4 RS codewords A, B, C, and D in a round robin manner, and 32 symbols in fourth rows are successively distributed by the four RS codewords D, C, B, and A in a round robin manner. Then, 10-bit distribution is performed on each row according to this rule.

The interleaving rule 4 of the interleaver may be expressed in a pseudo-code form as follows:
   For all k=0 to 67
   For all j=0 to 7
   if even(k)
   tX_out<32k+4j>=cA<543-8k-j>
   tX_out<32k+4j+1>=cB<543-8k-j>
   tX_out<32k+4j+2>=cC<543-8k-j>
   tX_out<32k+4j+3>=cD<543-8k-j>
   else
   tX_out<32k+4j>=cD<543-8k-j>
   tX_out<32k+4j+1>=cC<543-8k-j>
   tX_out<32k+4j+2>=cB<543-8k-j>
   tX_out<32k+4j+3>=cA<543-8k-j>

Data streams obtained through the interleaving of the interleaver rce are sent to an inner-FEC module through the PMA lanes for an inner code encoding operation. After the inner code encoding is complete, original data at PMA is directly multiplexed for $\pi_O$ interleaving. Finally, data modulation and optical-to-electrical conversion are performed on the data at PMD, and then data is transmitted to a communication medium through an MDI interface.

In the interleaving rule 1 to the interleaving rule 4, in a symbol distribution process of each row, the codeword A and the codeword B are always adjacent, and the codeword C and the codeword D are always adjacent. Therefore, the codeword A and the codeword B that are adjacent do not need to be distinguished, and the codeword C and the codeword D that are adjacent do not need to be distinguished, thereby reducing complexity. In this way, an interleaving depth of ne is increased from distribution of symbols of two RS codewords to distribution of symbols of four RS codewords, and a distribution pattern is changed from an odd-even distribution pattern in an original standard to a new distribution pattern. However, symbols of RS codewords at each flow of PCS layer may be adjacent, to be specific, symbols of the RS codewords A and B in FIG. 9 are adjacent, and symbols of the RS codewords C and D in FIG. 9 are adjacent. Such an interleaver embodiment can identify a symbol boundary, and a 10-bit granularity exactly matches a size of the RS symbol. Such an interleaver enables different RS symbols to be more randomly and evenly allocated to the inner-FEC codeword, so that a quantity of RS codewords at each flow of PCS layer can be compatible, and symbols of RS codewords in a data stream at the PCS layer do not need to be distinguished, thereby reducing an operation of identifying the RS symbol boundary, and improving a burst error resistance capability of the system.

Figure 10:
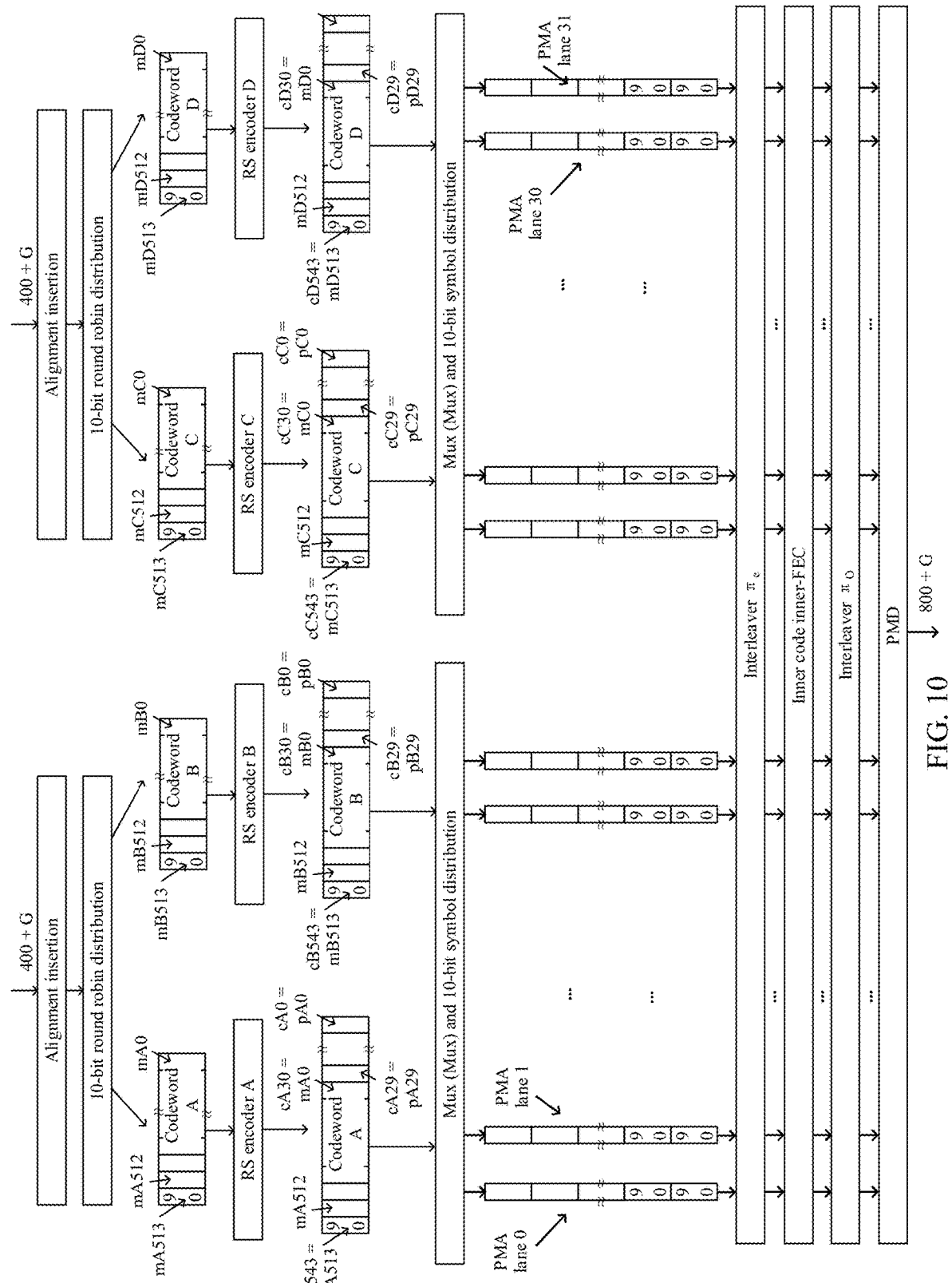
FIG. 10 is a schematic flowchart 2 of data processing according to an embodiment of this application.

With reference to the descriptions of the procedure 2, as shown in FIG. 10, a data processing procedure is described as follows:

Two 400 Gbps data streams enter alignment insertion (AM Insertion) modules. After alignment markers are inserted into the data streams, data streams are distributed to information symbols of RS codewords in a 10-bit round robin manner (10-bit round robin distribution). In FIG. 10, there are four RS codewords, which are denoted as a codeword A, a codeword B, a codeword C, and a codeword D respectively. For coding methods of the codeword A, the codeword B, the codeword C, and the codeword D, refer to related descriptions in FIG. 9. Details are not described herein again.

Encoding procedures of the codeword A, the codeword B, the codeword C, and the codeword D may correspond to the embodiment in FIG. 5. The y pieces of to-be-encoded information are encoded by using the first FEC codeword, to obtain the y groups of encoded data. The value of y is 4.

Two groups of encoded data obtained through encoding by using the codeword A and the codeword B are interleaved by using an interleaver of Mux and 10-bit symbol distribution, which may be denoted as third interleaving. Two groups of encoded data obtained through encoding by using the codeword C and the codeword D are interleaved by using the interleaver of Mux and 10-bit symbol distribution.

The four groups of encoded data interleaved by the interleaver of Mux and 10-bit symbol distribution are input to P PMA lanes, where P=32, namely, 32 columns of PMA lanes, j indicates a quantity of symbols of each RS in a row of each PMA lane, and L indicates a quantity of rows of the PMA lane. cA<543-8L-j> indicates a $(543-8L-j)^{th}$ symbol bit of the RS codeword A on the left side of FIG. 10, cB<543-8L-j> indicates a $(543-8L-j)^{th}$ symbol bit of the RS codeword B on the left side of FIG. 10, cC<543-8L-j> indicates a $(543-8L-j)^{th}$ symbol bit of the RS codeword C on the right side of FIG. 10, and cD<543-8L-j> indicates a $(543-8L-j)^{th}$ symbol bit of the RS codeword D on the right side of FIG. 10.

A data stream output from the 32 PMA lanes enters the interleaver $\pi_e$ for interleaving, and concatenated encoding of the second FEC codeword is performed on a data stream interleaved by the interleaver $\pi_e$ at the PMA layer. The encoded codeword is the second FEC codeword, namely, the inner-FEC codeword.

The interleaver $\pi_e$ is equivalent to performing secondary multiplexing and 10-bit symbol distribution on data output through the 32 PMA lanes. In this way, the two 400G PCS layer data streams are fully interleaved at the PMA layer. The data stream is transmitted to the PMA layer through an optical/electrical interface C2M. Therefore, a bit error is caused by the optical/electrical interface before the interleaver $\pi_e$. In this case, which symbols belong to which RS codeword cannot be known unless de-interleaving is completed at the PMA layer, which requires high costs. Therefore, if the interleaver $\pi_e$ is placed at the PMA layer, the interleaver $\pi_e$ is designed in a blind mode. The interleaver design is related to the PMA lane. An interleaving rule used by the interleaver $\pi_e$ may be, for example, the following interleaving rule 5.

The interleaving rule 5 is as follows:

There are 32 PMA lanes. A symbol output by the $j^{th}$ PMA lane from left to right is S<j>, where j=1, 2, . . . , 31, 32. A size of the symbol is 10 bits. tx_out indicates a data stream output by the interleaver at a symbol granularity.

The 32 PMA lanes correspond to sequence numbers 0 to (32−1), and 32 columns of an interleaving matrix respectively one-to-one correspond to encoded data from the 32 PMA lanes. Row elements whose column sequence numbers are odd numbers in a row of the interleaving matrix respectively correspond to encoded data of PMA lanes whose sequence numbers are 0 to (32/2−1), and row elements whose column sequence numbers are even numbers in the row of the interleaving matrix respectively correspond to encoded data of PMA lanes whose sequence numbers are 32/2 to 32. Definitely, alternatively, row elements whose column sequence numbers are even numbers in a row of the interleaving matrix respectively correspond to encoded data of PMA lanes whose sequence numbers are 0 to (32/2−1), and row elements whose column sequence numbers are odd numbers in the row of the interleaving matrix respectively correspond to encoded data of PMA lanes whose sequence numbers are 32/2 to 32.

The interleaving rule 5 of the interleaver $\pi_e$ may be expressed in a pseudo-code form as follows:
For all k=0 to 67
For all j=0 to 16
  If even(j)
  tx_out<32k+j>=S<j>
  else
  tx_out<32k+j>=S<16+j>

In such an interleaving method embodiment, the symbol boundary does not need to be identified, so that the PMA layer does not need to know a format of a data frame at the PCS layer, and directly performs multiplexing and 10-bit distribution on a data stream received at the PMA layer. 10 bits exactly match sizes of symbols of the second FEC codeword, thereby improving a burst error resistance capability of the system, and an implementation is simple.

Figure 11:
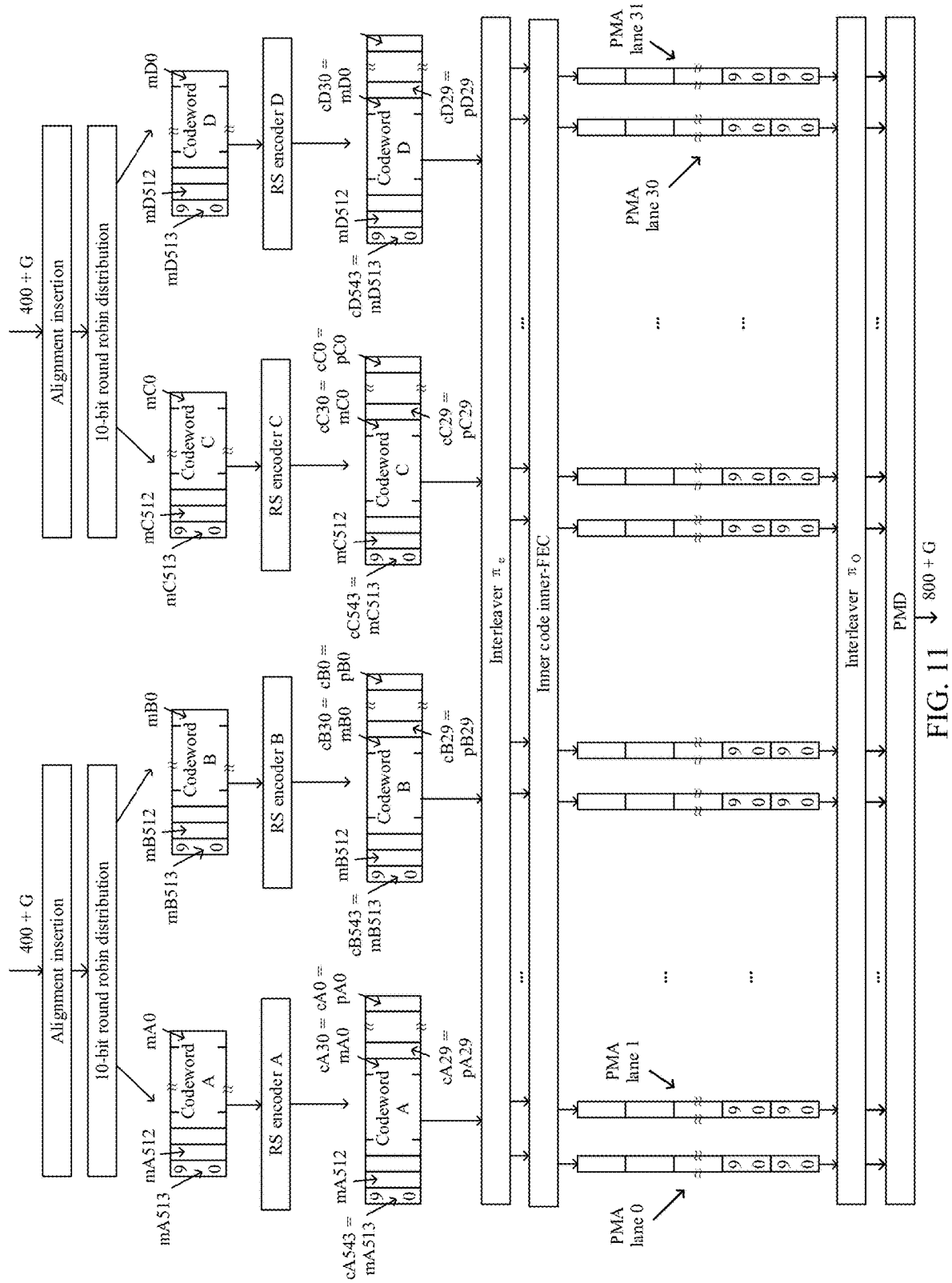
FIG. 11 is a schematic flowchart 3 of data processing according to an embodiment of this application.

With reference to the descriptions of the procedure 3, as shown in FIG. 11, a data processing procedure is described as follows:

For the procedure in FIG. 11, refer to the procedure shown in FIG. 9. A difference is that, in FIG. 9, after the four groups of encoded data are interleaved by using the interleaver $\pi_e$, the obtained first encoded data is transmitted through the 32 PMA lanes, and the first encoded data transmitted through the 32 PMA lanes is encoded by using the second FEC codeword, to obtain the second encoded data. In FIG. 11, after the four groups of encoded data are interleaved by using the interleaver $\pi_e$, the first encoded data is obtained, the first encoded data is encoded by using the second FEC codeword, to obtain the second encoded data, the second encoded data is transmitted through the 32 PMA lanes, and the second encoded data transmitted through the 32 PMA lanes is processed.

It can be learned that a difference between FIG. 11 and FIG. 9 lies in a different location of second FEC encoding. In addition, for details of each operation, refer to the descriptions in the embodiment in FIG. 9. For the interleaving rule, also refer to the descriptions in FIG. 9, and details are not described herein again.

It may be understood that FIG. 9 to FIG. 11 are described by using Example 1 shown in FIG. 8 as an example, in other words, two 400GE Ethernet layer architectures are combined into the 800G Ethernet layer in parallel. When the Ethernet layer architecture is in another composition manner, a data processing procedure is similar. The following uses Example 2 as an example, in other words, four 200GE Ethernet layer architectures are combined into the 800G Ethernet layer in parallel, to describe a data processing procedure.

Four 200 Gbps data streams enter alignment insertion (AM Insertion) modules. After alignment markers are inserted into the data streams, data streams are distributed to information symbols of RS codewords in a 10-bit round robin manner (10-bit round robin distribution). There are eight RS codewords, which are denoted as a codeword A, a codeword B, a codeword C, a codeword D, a codeword E, a codeword F, a codeword G, and a codeword H, respectively. For an RS encode scheme of each codeword, refer to related descriptions in the embodiment in FIG. 9.

After the interleaver $\pi_e$ interleaves four groups of encoded data at the PCS layer, concatenated encoding is performed on a data stream at the PMA layer through an optical/electrical interface C2M. The encoded codeword is inner-FEC.

There are P PMA lanes, where P=32, namely, 32 columns of PMA lanes, j indicates a quantity of symbols of each RS codeword in a row of each PMA lane, and L indicates a quantity of rows of the PMA lane.

cA<543-4L-j> indicates a $(543-4L-j)^{th}$ symbol bit of the RS codeword A, cB<543-4L-j> indicates a $(543-4L-j)^{th}$ symbol bit of the RS codeword B, cC<543-4L-j> indicates a $(543-4L-j)^{th}$ symbol bit of the RS codeword C, cD<543-4L-j> indicates a $(543-4L-j)^{th}$ symbol bit of the RS codeword D, cE<543-4L-j> indicates a $(543-4L-j)^{th}$ symbol bit of the RS codeword E, cF<543-4L-j> indicates a $(543-4L-j)^{th}$ symbol bit of the RS codeword F, cG<543-4L-j> indicates a $(543-4L-j)^{th}$ symbol bit of the RS codeword G, and cH<543-4L-j> indicates a $(543-4L-j)^{th}$ symbol bit of the RS codeword H. tx_out indicates a data stream output by the interleaver at a symbol granularity. tx_out<32L+8j> indicates a $(32L+8j)^{th}$ symbol of the data stream output by the interleaver, tx_out<32L+8j+1> indicates a $(32L+8j+1)^{th}$ symbol of the data stream output by the interleaver, tx_out<32L+8j+2> indicates a $(32L+8j+2)^{th}$ symbol of the data stream output by the interleaver, tx_out<32L+8j+3> indicates a $(32L+8j+3)^{th}$ symbol of the data stream output by the interleaver, tx_out<32L+8j+4> indicates a $(32L+8j+4)^{th}$ symbol of the data stream output by the interleaver, tx_out<32L+8j+5> indicates a $(32L+8j+5)^{th}$ symbol of the data stream output by the interleaver, tx_out<32L+8j+6> indicates a $(32L+8j+6)^{th}$ symbol of the data stream output by the interleaver, and tx_out<32L+8j+7> indicates a $(32L+8j+7)^{th}$ symbol of the data stream output by the interleaver.

An interleaving rule used by the interleaver πe may be an interleaving rule 6.

The interleaving rule 6 is as follows: 32 symbols in first rows on the 32 PMA lanes are successively distributed by the eight RS codewords A, B, C, D, E, F, G and H in a round robin manner, 32 symbols in second rows are successively distributed by the eight RS codewords C, D, E, F, G, H, A and B in a round robin manner, 32 symbols in third rows are successively distributed by the eight RS codewords E, F, G, H, A, B, C and D in a round robin manner, 32 symbols in fourth rows are successively distributed by the eight RS codewords G, H, A, B, C, D, E and F in a round robin manner, 32 symbols in fifth rows are successively distributed by the eight RS codewords H, G, F, E, D, C, B and A in a round robin manner, 32 symbols in sixth rows are successively distributed by the eight RS codewords B, A, H, G, F, E, D and C in a round robin manner, 32 symbols in seventh rows are successively distributed by the eight RS codewords D, C, B, A, H, G, F and E in a round robin manner, and 32 symbols in eighth rows are successively distributed by the eight RS codewords F, E, D, C, B, A, H and G in a round robin manner. Then, 10-bit distribution is performed on each row according to this rule. Actually, as long as it is ensured that round robin rules of every eight consecutive rows are different, the round robin rules in the rule 6 are examples.

The interleaving rule 6 of the interleaver rce may be expressed in a pseudo-code form as follows:
For all k=0 to 67
For all j=0 to 4
if (k%8==0)
tX_out<32k+8j>=cA<543-4k-j>
tX_out<32k+8j+1>=cB<543-4k-j>
tX_out<32k+8j+2>=cC<543-4k-j>
tX_out<32k+8j+3>=cD<543-4k-j>
tX_out<32k+8j+4>=cE<543-4k-j>
tX_out<32k+8j+5>=cF<543-4k-j>
tX_out<32k+8j+6>=cG<543-4k-j>
tX_out<32k+8j+7>=cH<543-4k-j>
else if (k%8==1)

tX_out<32k+8j>=cC<543-4k-j>
tX_out<32k+8j+1>=cD<543-4k-j>
tX_out<32k+8j+2>=cE<543-4k-j>
tX_out<32k+8j +3>=cF<543-4k-j>
tx_out<32k+8j+4>=cG<543-4k-j>
tX_out<32k+8j+5>=cH<543-4k-j>
tx_out<32k+8j+6>=cA<543-4k-j>
tX_out<32k+8j+7>=cB<543-4k-j>
else if (k%8==2)
tx_out<32k+8j>=cE<543-4k-j>
tX_out<32k+8j+1>=cF<543-4k-j>
tx_out<32k+8j+2>=cG<543-4k-j>
tX_out<32k+8j+3>=cH<543-4k-j>
tX_out<32k+8j+4>=cA<543-4k-j>
tX_out<32k+8j+5>=cB<543-4k-j>
tx_out<32k+8j+6>=cC<543-4k-j>
tX_out<32k+8j+7>=cD<543-4k-j>
else if (k%8==3)
tX_out<32k+8j>=cG<543-4k-j>
tX_out<32k+8j+1>=cH<543-4k-j>
tX_out<32k+8j+2>=cA<543-4k-j>
tX_out<32k+8j+3>=cB<543-4k-j>
tx_out<32k+8j+4>=cC<543-4k-j>
tX_out<32k+8j+5>=cD<543-4k-j>
tX_out<32k+8j+6>=cE<543-4k-j>
tX_out<32k+8j+7>=cF<543-4k-j>
if (k%8==4)
tx_out<32k+8j>=cH<543-4k-j>
tx_out<32k+8j+1>=cG<543-4k-j>
tX_out<32k+8j +2>=cF<543-4k-j>
tX_out<32k+8j +3>=cE<543-4k-j>
tX_out<32k+8j+4>=cD<543-4k-j>
tX_out<32k+8j+5>=cC<543-4k-j>
tX_out<32k+8j +6>=cB<543-4k-j>
tX_out<32k+8j+7>=cA<543-4k-j>else if (k%8==5)
tX_out<32k+8j>=cB<543-4k-j>
tX_out<32k+8j+1>=cA<543-4k-j>
tX_out<32k+8j+2>=cH<543-4k-j>
tX_out<32k+8j+3>=cG<543-4k-j>
tX_out<32k+8j+4>=cF<543-4k-j>
tX_out<32k+8j+5>=cE<543-4k-j>
tX_out<32k+8j+6>=cD<543-4k-j>
tX_out<32k+8j+7>=cC<543-4k-j>
else if (k%8==6)
tX_out<32k+8j>=cD<543-4k-j>
tX_out<32k+8j+1>=cC<543-4k-j>
tX_out<32k+8j+2>=cB<543-4k-j>
tX_out<32k+8j+3>=cA<543-4k-j>
tX_out<32k+8j+4>=cH<543-4k-j>
tX_out<32k+8j+5>=cG<543-4k-j>
tX_out<32k+8j+6>=cF<543-4k-j>
tX_out<32k+8j+7>=cE<543-4k-j>
else if (k%8==7)
tX_out<32k+8j>=cF<543-4k-j>
tX_out<32k+8j+1>=cE<543-4k-j>
tX_out<32k+8j+2>=cD<543-4k-j>
tX_out<32k+8j +3>=cC<543-4k-j>
tX_out<32k+8j+4>=cB<543-4k-j>
tX_out<32k+8j+5>=cA<543-4k-j>
tX_out<32k+8j+6>=cH<543-4k-j>
tX_out<32k+8j+7>=cG<543-4k-j>

In this symbol distribution manner, an interleaving depth of ne may be increased from distribution of two RS symbols to distribution of eight RS symbols, and a distribution pattern is changed from an odd-even distribution pattern in an original standard to a new distribution pattern. However, symbols of RS codewords at each flow of PCS layer may be adjacent, to be specific, symbols of the RS codewords A and B are adjacent, symbols of the RS codewords C and D are adjacent, symbols of the RS codewords E and F are adjacent, and symbols of the RS codewords G and H are adjacent.

Data streams obtained through the interleaving are sent to an inner-FEC module through the PMA lanes for an inner code encoding operation. After the inner code encoding is complete, original data at PMA is directly multiplexed for $\pi_O$ interleaving. Finally, data modulation and optical-to-electrical conversion are performed on the data at PMD, and data is transmitted to a communication medium through an MDI interface.

Figure 12:
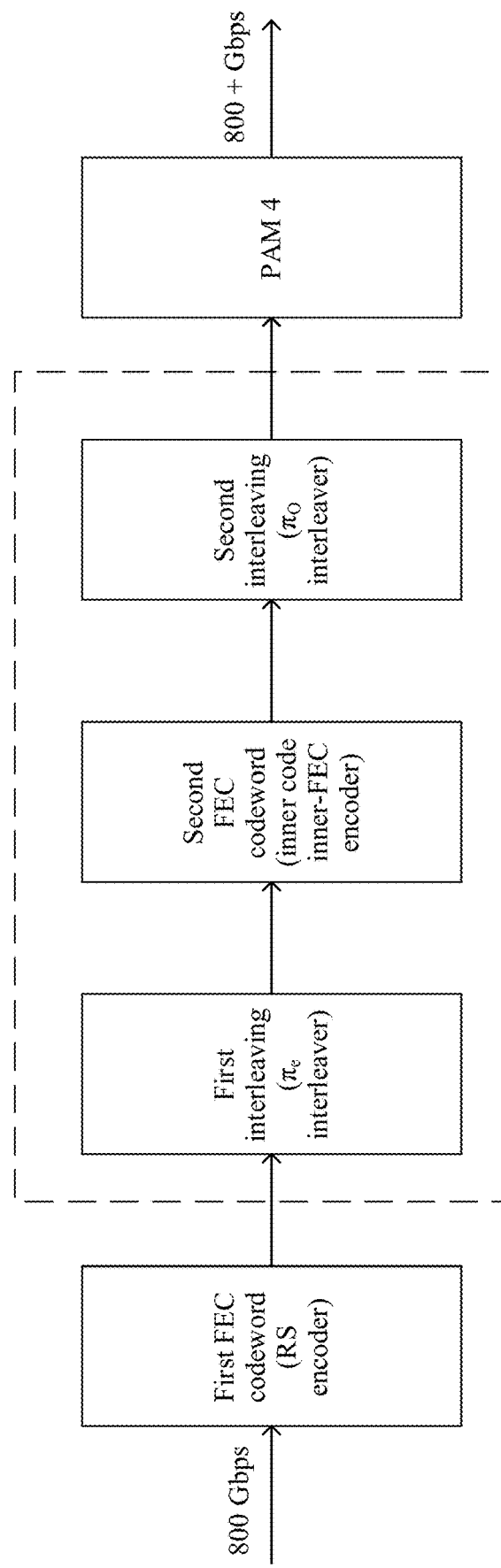
FIG. 12 is a schematic flowchart 2 of an Ethernet coding method according to an embodiment of this application.

Based on the foregoing descriptions, in a possible embodiment, a schematic flowchart of the Ethernet coding method provided in embodiments of this application may be shown in FIG. 12. A main procedure includes: An RS encoder encodes a to-be-encoded data stream, an interleaver $\pi_e$ performs interleaving on an encoded data stream, an inner-FEC encoder encodes an interleaved encoded data stream, and an interleaver $\pi_o$ performs interleaving on an interleaved encoded data stream. ne may use original round robin distribution, or use another distribution or interleaving manner. Certainly, a sequence of the operations may be changed. For details, refer to the foregoing descriptions in the embodiments. FIG. 12 is a schematic diagram of a manner.

In conclusion, error correction performance of the RS codeword in 100GE, 200GE, and 400GE Ethernet technologies is limited. Therefore, even if 10-bit RS symbol distribution technologies of the 200GE and 400GE Ethernet are applied to a next-generation Ethernet coding scheme, and the symbol distribution is essentially a weak interleaver, a requirement of a BER performance technical indicator of the next-generation Ethernet still cannot be met in performance. Error correction performance may be improved by increasing OHs of the system. In embodiments of this application, a concatenated inner-FEC codeword is designed, and the OHs of the system are added based on compatibility with most protocol layers of IEEE 802.3bj and IEEE 802.3bs. In a joint optimization embodiment of the architecture and coding, PCS-layer coding is decoupled from PMA-layer coding. Coding at each layer is responsible for different error types and error distribution. This brings optimal coding benefits on the entire system, and implementation complexity is the lowest. A latency and a resource consumption level are optimal solutions.

In addition, according to the method provided in embodiments of this application, a problem that a bit error type and bit error distribution do not match error correction efficiency of the inner-FEC codeword is resolved. Interleaving between the first FEC codeword (the RS codeword) and the second FEC codeword (inner-FEC) is to aggregate bit errors left after encoding by using the inner-FEC into one RS symbol (10 bits), so that a Hamming distance at a symbol level between the RS and the inner-FEC is minimized, and error correction efficiency of the RS is improved. Interleaving between a lane and the inner-FEC reduces a burst error of the lane to a certain extent, so that a burst error length is within a correctable range of the inner-FEC, and error correction efficiency of the inner-FEC is improved.

Therefore, in the solutions provided in embodiments of this application, technical indicators such as the latency, calculation complexity, resource consumption, and system compatibility can achieve comprehensive optimal effect while a next-generation Ethernet performance indicator is met.

Figure 13:
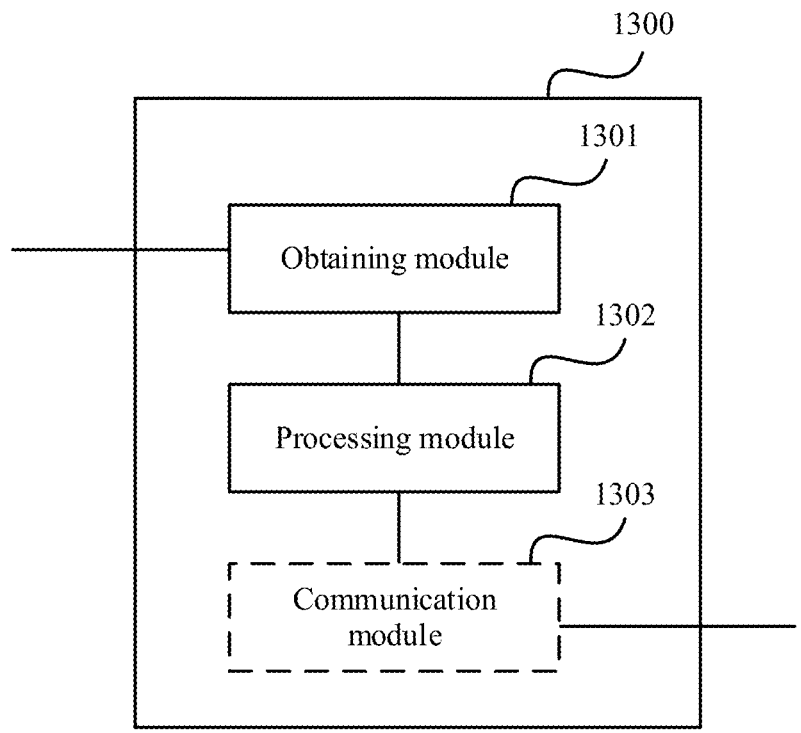
FIG. 13 is a schematic diagram 1 of a structure of an Ethernet coding apparatus according to an embodiment of this application.

Based on a same technical concept as the foregoing Ethernet coding method, as shown in FIG. 13, an embodiment of this application further provides an Ethernet coding apparatus 1300. The apparatus 1300 has a function of implementing the foregoing Ethernet coding method. The function may be implemented by hardware, or may be implemented by hardware executing corresponding software. The hardware or the software includes one or more modules corresponding to the foregoing function. In an embodiment, the apparatus 1300 may include an obtaining module 1301 and a processing module 1302.

For example, the obtaining module 1301 is configured to obtain first to-be-encoded information, and the processing module 1302 is configured to encode the first to-be-encoded information by using a first forward error correction FEC codeword, to obtain first encoded data, where the first forward error correction FEC codeword is a Reed-Solomon forward error correction RS-FEC codeword. The processing module 1302 is further configured to encode the first encoded data by using a second FEC codeword, to obtain second encoded data, where a code length N and an information bit length K of the second FEC codeword satisfy the following formula: M1*N/K≤M2. M1 is a throughput of the first encoded data, and M2 is a throughput of the second encoded data.

In some embodiments, when performing FEC encoding on the first to-be-encoded information by using the first FEC codeword, to obtain the first encoded data, the processing module 1302 is configured to: perform FEC encoding on the first to-be-encoded information by using y first FEC codewords, to obtain y groups of coded data, where y is an even number greater than or equal to 2; and perform first interleaving on the y groups of coded data to obtain the first encoded data, where the first interleaving meets an interleaving matrix in which quantities of rows and columns are respectively L and P, L and P are even numbers greater than or equal to 2, and P is a quantity of physical medium attachment PMA sublayer lanes.

In some embodiments, row elements in a row of the interleaving matrix respectively correspond to data obtained from the y groups of encoded data in a round robin manner.

In some embodiments, a same round robin rule is used for each of the L rows, or round robin rules are different for every Y consecutive rows in the L rows.

In some embodiments, when encoding the first encoded data by using the second FEC codeword, the processing module 1302 is configured to: transmit the first encoded data through P PMA lanes; and encode the first encoded data transmitted through the P PMA lanes.

In some embodiments, the processing module 1302 is further configured to: transmit the second encoded data through P PMA lanes, and process the second encoded data transmitted through the P PMA lanes.

In some embodiments, when performing the first interleaving on the y groups of encoded data, the processing module 1302 is configured to: transmit the y groups of encoded data through P PMA lanes; and perform the first interleaving on the y groups of encoded data transmitted through the P PMA lanes.

In some embodiments, the P PMA lanes correspond to sequence numbers 0 to (P−1), and the P columns of the interleaving matrix respectively one-to-one correspond to encoded data from the P PMA lanes. Row elements whose column sequence numbers are odd numbers in a row of the interleaving matrix respectively correspond to encoded data of PMA lanes whose sequence numbers are 0 to (P/2−1), and row elements whose column sequence numbers are even numbers in the row of the interleaving matrix respectively correspond to encoded data of PMA lanes whose sequence numbers are P/2 to P.

In some embodiments, a value of P is 16 or 32.

In some embodiments, K further satisfies the following condition: N1/K is a positive integer, and N1 is a code length of the first FEC codeword.

In some embodiments, N and K further satisfy the following condition: M1*N/K=reference clock×W, where W is a positive integer.

In some embodiments, W=4×reference clock multiplier RCM.

In some embodiments, M1=106.25 Gbps, and M2=114 Gbps.

In some embodiments, N/K=18/17.

Construction of the second FEC codeword is (N,K,m), N is a quantity of bits included in the second FEC codeword, K is a quantity of bits included in an information bit, and m is an order of a Galois field in which the second FEC codeword is located. The second FEC codeword includes any one of the following codewords, includes a spatially coupled code constructed by using any one of the following codewords as a subcode, or includes a multi-level code constructed by using any one of the following codewords as a subcode: Hamming code Hamming(144,136,8), Hamming (180,170,10), extended Hamming code eHamming(180,170, 9), double extended Hamming code DE-Hamming(180,170, 8), BCH(360,340,10), double extended BCH code DE-BCH (360,340,9), DE-BCH(576,544,10), BCH(594,561,11), or Hamming(180,170,10).

In some embodiments, construction of the second FEC codeword is (N,K,m), N is a quantity of bits included in the second FEC codeword, K is a quantity of bits included in an information bit, and m is an order of a Galois field in which the FEC codeword is located. The second FEC codeword includes any one of the following codewords, includes a spatially coupled code constructed by using any one of the following codewords as a subcode, or includes a multi-level code constructed by using any one of the following codewords as a subcode: Hamming(126,119,7), Hamming(127, 119,8), Hamming(145,136,9), Hamming(179,170,9), eHamming(127,119,7), eHamming(145,136,8), eHamming(179, 170,8), eHamming(181,170,10), BCH(290,272,9), BCH (358,340,9), BCH(574,544,10), extended BCH code eBCH (291,272,9), eBCH(359,340,9), eBCH(361,340,10), eBCH (575,544,10), or DE-BCH(362,340,10).

In some embodiments, the processing module 1302 is further configured to perform one or more of the following processing on the second encoded data: transmission through the P PMA lanes, second interleaving, data modulation, or optical-to-electrical conversion, where P is an even number greater than or equal to 2. The apparatus further includes a communication module 1303, configured to send processed data to a receiving device.

In some embodiments, N=x*n and K=x*k; and x, n, and k are positive integers.

Figure 14:
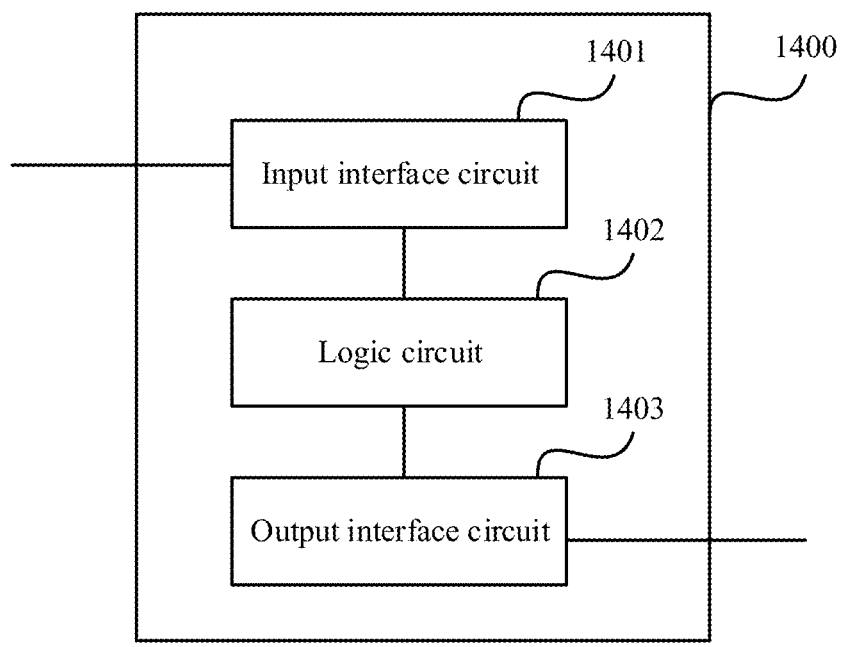
FIG. 14 is a schematic diagram 2 of a structure of an Ethernet coding apparatus according to an embodiment of this application.

As shown in FIG. 14, an embodiment of this application further provides an Ethernet coding apparatus 1400. The Ethernet coding apparatus 1400 may be configured to perform the foregoing Ethernet coding method. A part or all of the foregoing Ethernet coding method may be implemented by hardware or may be implemented by software. When a part or all of the foregoing Ethernet coding method is implemented by hardware, the Ethernet coding apparatus 1400 includes: an input interface circuit 1401, configured to obtain first to-be-encoded information; a logic circuit 1402, configured to perform the foregoing Ethernet coding method, and an output interface circuit 1403, configured to output second encoded data. For details, refer to the descriptions in the foregoing method embodiments, and details are not described herein again.

In some embodiments, the Ethernet coding apparatus 1400 may be a chip or an integrated circuit.

Figure 15:
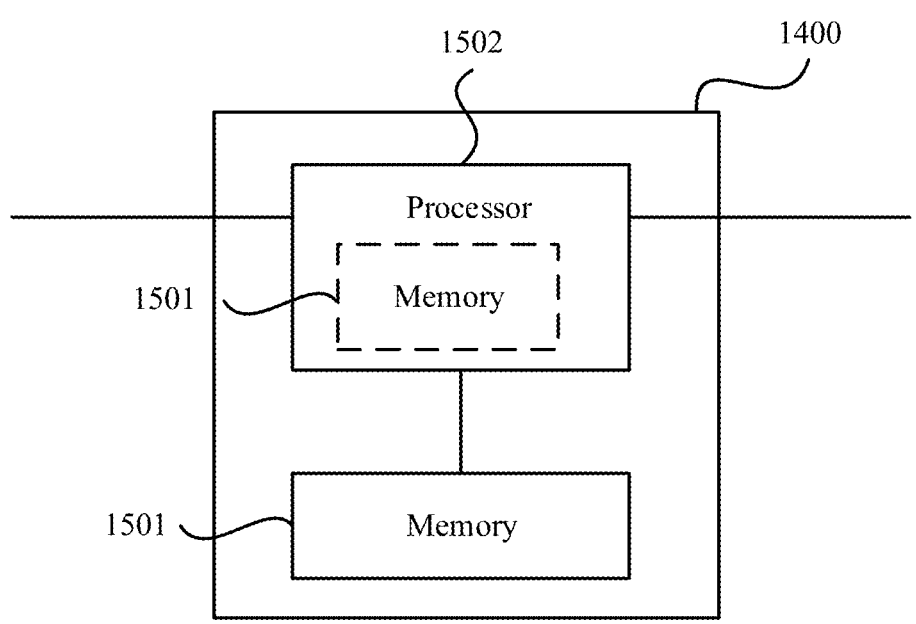
FIG. 15 is a schematic diagram 3 of a structure of an Ethernet coding apparatus according to an embodiment of this application.

In some embodiments, when a part or all of the Ethernet coding method in the foregoing embodiments are implemented by software, as shown in FIG. 15, the Ethernet coding apparatus 1400 includes: a memory 1501, configured to store a program; and a processor 1502, configured to execute the program stored in the memory 1501. When the program is executed, the Ethernet coding apparatus 1400 can implement the Ethernet coding method provided in the foregoing embodiments.

In some embodiments, the memory 1501 may be a physically independent unit, or the memory 1501 and the processor 1502 may be integrated together.

In some embodiments, when a part or all of the foregoing Ethernet coding method is implemented by software, the Ethernet coding apparatus 1400 may alternatively include only a processor 1502. A memory 1501 configured to store a program is located outside the Ethernet coding apparatus 1400. The processor 1502 is connected to the memory 1501 through a circuit/wire, and is configured to read and execute the program stored in the memory 1501.

The processor 1502 may be a central processing unit (CPU), a network processor (NP), or a combination of the CPU and the NP.

The processor 1502 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 1501 may include a volatile memory, for example, a random access memory (RAM). Alternatively, the memory 1501 may include a non-volatile memory, for example, a flash memory, a hard disk drive (HDD), or a solid-state drive (SSD). Alternatively, the memory 1501 may include a combination of the foregoing types of memories.

The Ethernet coding apparatus 1400 may alternatively be a chip, an integrated circuit, or a chip system.

An embodiment of this application may further provide a chip, including a processor, configured to support the Ethernet coding apparatus 1400 to implement the functions in the foregoing method embodiments. In a possible embodiment, the chip is connected to a memory or the chip includes a memory, and the memory is configured to store program instructions and data that are utilized for the Ethernet coding apparatus 1400.

An embodiment of this application provides a computer-readable storage medium storing a computer program. The computer program includes instructions used to perform the foregoing method embodiments.

An embodiment of this application provides a computer program product including instructions. When the computer program product runs on a computer, the foregoing method embodiments are implemented.

A person skilled in the art should understand that embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by the computer or the processor of any other programmable data processing device generate an apparatus for implementing a function in one or more processes in the flowcharts and/or in one or more blocks in the block diagrams.

These computer program instructions may alternatively be stored in a computer-readable memory that can instruct the computer or any other programmable data processing device to work in a specific manner, so that the instructions stored in the computer-readable memory generate an artifact that includes an instruction apparatus. The instruction apparatus implements a function in one or more processes in the flowcharts and/or in one or more blocks in the block diagrams.

The computer program instructions may alternatively be loaded onto a computer or another programmable data processing device, so that a series of operations and steps are performed on the computer or the another programmable device, and computer-implemented processing is generated. Therefore, the instructions executed on the computer or the another programmable device provide operations for implementing a function in one or more processes in the flowcharts and/or in one or more blocks in the block diagrams.

Although embodiments of this application have been described, a person skilled in the art can make changes and modifications to these embodiments once they learn the basic inventive concept. Therefore, the following claims are intended to be construed as to cover the preferred embodiments and all changes and modifications falling within the scope of this application.

Clearly, persons skilled in the art can make various modifications and variations to embodiments of this application without departing from the spirit and scope of embodiments of this application. This application is intended to cover these modifications and variations provided that they fall within the scope of protection defined by the following claims and their equivalent technologies.

What is claimed is:

1. A coding method, comprising:
   encoding, by a transmit end, first to-be-encoded information by using a first forward error correction (FEC) codeword, to obtain first encoded data, wherein the first FEC codeword is a Reed-Solomon forward error correction (RS-FEC) codeword; and
   encoding, by the transmit end, the first encoded data by using a second FEC codeword, to obtain second encoded data, wherein a code length N and an information bit length K of the second FEC codeword satisfy the following formula: M1*N/K≤M2, wherein M1 is a rate of the first encoded data, and M2 is a rate at a physical media dependent (PMD) layer;

wherein encoding, by the transmit end, the first to-be-encoded information by using the first FEC codeword, to obtain the first encoded data comprises:
performing, by the transmit end, FEC encoding on the first to-be-encoded information by using y first FEC codewords, to obtain y groups of encoded data, wherein y is an even number greater than or equal to 2; and
performing, by the transmit end, first interleaving on the y groups of encoded data to obtain the first encoded data, wherein the first interleaving meets an interleaving matrix in which quantities of rows and columns are respectively L and P, L and P are even numbers greater than or equal to 2, and P is a quantity of data output lanes that transmit the first encoded data;
wherein encoding, by the transmit end, the first encoded data by using the second FEC codeword comprises:
encoding the first encoded data transmitted through P data output lanes.

2. The method according to claim 1, wherein the data output lanes comprise physical medium attachment (PMA) lanes or physical coding sublayer (PCS) lanes.

3. The method according to claim 1, wherein row elements in a row of the interleaving matrix respectively correspond to data obtained from the y groups of encoded data in a round robin distribution.

4. The method according to claim 2, wherein a same round robin rule is used for each of the L rows, or different round robin rules are used for every consecutive y rows in the L rows.

5. The method according to claim 1, wherein the method further comprises:
transmitting, by the transmit end, the second encoded data through P physical medium attachment (PMA) lanes, and processing the second encoded data transmitted through the P PMA lanes.

6. The method according to claim 2, wherein performing, by the transmit end, the first interleaving on the y groups of encoded data comprises:
transmitting, by the transmit end, the y groups of encoded data through P PMA lanes; and
performing the first interleaving on the y groups of encoded data transmitted through the P PMA lanes.

7. The method according to claim 6, wherein the P PMA lanes correspond to sequence numbers 0 to (P−1), and the P columns of the interleaving matrix respectively one-to-one correspond to encoded data from the P PMA lanes; and row elements whose column sequence numbers are odd numbers in a row of the interleaving matrix respectively correspond to encoded data of PMA lanes whose sequence numbers are 0 to (P/2−1), and row elements whose column sequence numbers are even numbers in the row of the interleaving matrix respectively correspond to encoded data of PMA lanes whose sequence numbers are P/2 to P.

8. The method according to claim 1, wherein a value of P is 16 or 32.

9. The method according to claim 1, wherein N/K=18/17.

10. The method according to claim 1, wherein construction of the second FEC codeword is (N,K,m) and m is an order of a Galois field in which the second FEC codeword is located; and
the second FEC codeword comprises any one of the following codewords, comprises a spatially coupled code constructed by using any one of the following codewords as a subcode, or comprises a multi-level code constructed by using any one of the following codewords as a subcode: Hamming code Hamming(144,136,8), Hamming(180,170,10), extended Hamming code eHamming(180,170,9), double extended Hamming code DE-Hamming(180,170,8), Bose, Ray-Chaudhuri, and Hocquenghem code BCH(360,340,10), double extended BCH code DE-BCH(360,340,9), DE-BCH(576,544,10), or BCH(594,561,11).

11. The method according to claim 1, wherein construction of the second FEC codeword is (N,K,m) and m is an order of a Galois field in which the FEC codeword is located; and
the second FEC codeword comprises any one of the following codewords, comprises a spatially coupled code constructed by using any one of the following codewords as a subcode, or comprises a multi-level code constructed by using any one of the following codewords as a subcode: Hamming(126,119,7), Hamming(127,119,8), Hamming(145,136,9), Hamming(179,170,9), eHamming(127,119,7), eHamming(145,136,8), eHamming(179,170,8), eHamming(181,170,10), Bose, Ray-Chaudhuri, and Hocquenghem code BCH(290,272,9), BCH(358,340,9), BCH(574,544,10), extended BCH code eBCH(291,272,9), eBCH(359,340,9), eBCH(361,340,10), eBCH(575,544,10), or DE-BCH(362,340,10).

12. The method according to claim 1, wherein the method further comprises:
performing, by the transmit end, one or more of the following processing on the second encoded data: transmission through P data output lanes, second interleaving, data modulation, or optical-to-electrical conversion, wherein P is an even number greater than or equal to 2; and
sending, by the transmit end, processed data to a receiving device.

13. An apparatus, comprising:
an input interface circuit, configured to obtain first to-be-encoded information;
one or more logic circuits, configured to:
encode the first to-be-encoded information by using y first forward error correction (FEC) codewords, to obtain y groups of encoded data, wherein y is an even number greater than or equal to 2, wherein the first FEC codewords are Reed-Solomon forward error correction (RS-FEC) codewords;
perform first interleaving on the y groups of encoded data to obtain a first encoded data, wherein the first interleaving meets an interleaving matrix in which quantities of rows and columns are respectively L and P, L and P are even numbers greater than or equal to 2, and P is a quantity of data output lanes that transmit the first encoded data; and
encode the first encoded data transmitted through P data output lanes by using a second FEC codeword to obtain second encoded data, wherein a code length N and an information bit length K of the second FEC codeword satisfy the following formula: M1*N/K≤M2, wherein M1 is a rate of the first encoded data, and M2 is a rate at a physical media dependent (PMD) layer; and
an output interface circuit, configured to output the second encoded data.

14. An apparatus comprising:
at least one memory; and
one or more processors, configured to:
encode, first to-be-encoded information by using y first forward error correction (FEC) codewords, to obtain y groups of encoded data, wherein y is an even number greater than or equal to 2, wherein the first FEC codewords are Reed-Solomon forward error correction (RS-FEC) codewords; and perform first interleaving on the y groups of encoded data to obtain the first encoded data, wherein the first interleaving meets an interleaving matrix in which quantities of rows and columns are respectively L and P, L and P are even numbers greater than or equal to 2, and P is a quantity of data output lanes that transmit the first encoded data; and encode, the first encoded data transmitted through P data output lanes by using a second FEC codeword, to obtain second encoded data, wherein a code length N and an information bit length K of the second FEC codeword satisfy the following formula: $M1*N/K \leq M2$, wherein M1 is a rate of the first encoded data, and M2 is a rate at a physical media dependent (PMD) layer.

15. The apparatus according to claim 14, wherein the data output lanes comprise physical medium attachment (PMA) lanes or physical coding sublayer (PCS) lanes.

16. The method according to claim 1, wherein the P data output lanes are real lanes or virtual lanes.

17. The method according to claim 1, wherein y=4.

18. The method according to claim 1, wherein N=x*n and K=x*k; and x, n, and k are positive integers, wherein x=8.

19. The apparatus according to claim 14, wherein the P data output lanes are real lanes or virtual lanes.

20. The apparatus according to claim 14, wherein y=4.

21. The apparatus according to claim 14, wherein N=x*n and K=x*k; and x, n, and k are positive integers, wherein x=8.

* * * * *